United States Patent [19]
Sato et al.

[11] Patent Number: 6,136,684
[45] Date of Patent: Oct. 24, 2000

[54] SEMICONDUCTOR SUBSTRATE AND PROCESS FOR PRODUCTION THEREOF

[75] Inventors: Nobuhiko Sato, Yokohama; Takao Yonehara, Atsugi, both of Japan

[73] Assignee: Canon Kabushiki Kaisha, Tokyo, Japan

[21] Appl. No.: 08/683,864

[22] Filed: Jul. 19, 1996

[30] Foreign Application Priority Data

Jul. 21, 1995 [JP] Japan .................................. 7-185510

[51] Int. Cl.$^7$ .............................................. H01L 21/4763
[52] U.S. Cl. .......................... 438/624; 438/409; 438/413; 438/753
[58] Field of Search ..................... 438/155, 164, 438/795, 910, 930, 459, 753, 703, 705, 624, 409, 413

[56] References Cited

U.S. PATENT DOCUMENTS

| | | | |
|---|---|---|---|
| 5,278,092 | 1/1994 | Sato .......................................... | 437/90 |
| 5,278,093 | 1/1994 | Yonehara ................................. | 437/109 |
| 5,290,712 | 3/1994 | Sato et al. ................................ | 437/24 |
| 5,320,907 | 6/1994 | Sato ........................................ | 428/446 |
| 5,363,793 | 11/1994 | Sato ........................................... | 117/2 |
| 5,403,771 | 4/1995 | Nishida et al. ........................... | 437/89 |
| 5,457,058 | 10/1995 | Yonehara ................................. | 437/24 |
| 5,559,042 | 9/1996 | Yamazaki et al. ....................... | 437/21 |
| 5,670,411 | 9/1997 | Yonehara et al. ....................... | 438/459 |
| 5,679,475 | 10/1997 | Yamagata et al. ...................... | 428/698 |

FOREIGN PATENT DOCUMENTS

| | | |
|---|---|---|
| 0469630A2 | 2/1992 | European Pat. Off. . |
| 0553852A2 | 8/1993 | European Pat. Off. . |
| 5021338 | 1/1993 | Japan . |

OTHER PUBLICATIONS

A. Uiilir, Jr., "Electrolytic Shaping of Germanium and Silicon", *The Bell System Technical Journal,* vol. XXXV 1956, pp. 333–347.

T. Unagami et al., "Structure of Porous Silicon Layer and Heat–Treatment Effect", *Journal of the Electrochemical Society,* vol. 125, No. 8, Aug. 1978, pp. 1339–1344.

K. Izumi et al., "C.M.O.S Devices Fabricated on Buried $SiO_2$ Layers Formed By Oxygen Implantation Into Silicon", *Electronics Letters,* vol. 14, No. 18 Aug. 31, 1978, pp. 593–594.

K. Imai, "A New Dielectric Isolation Method Using Porous Silicon", *Solid–State Electronics,* vol. 24, Mar. 13, 1980, pp. 159–164.

H. Takai et al., "Isolation of Silicon Films Grown On Porous Silicon Layer", *Journal of Electronic Materials,* vol. 12, No. 6, Nov. 1983, pp. 973–982.

J.B. Lasky et al., "Silicon–on–Insulator (SOI) by Bonding and Etch–Back", *Int'l. Electron Devices Meeting,* Dec. 1–4, 1985, Washington, D.C., pp. 684–687.

H. Takai et al., "Porous silicon layers and its oxide for the silicon–on–insulator structure", *Journal of Applied Physics,* vol. 60, No. 1, Jul. 1986, pp. 222–225.

(List continued on next page.)

*Primary Examiner*—Charles Bowers
*Assistant Examiner*—Renee' R. Berry
*Attorney, Agent, or Firm*—Fitzpatrick, Cella, Harper & Scinto

[57] ABSTRACT

A process for producing a semiconductor substrate is provided which comprises providing a first member having a porous monocrystalline silicon layer and a nonporous monocrystalline silicon layer grown thereon, laminating the nonporous silicon layer of the first member onto a second member with interposition of an insulation layer provided on at least one lamination face of the first member and the second member, and removing the porous monocrystalline silicon layer by etching, wherein the nonporous monocrystalline silicon layer is grown at a low growth rate controlled such that the density of remaining pores on the crystal growth face is not more than $1000/cm^2$ at the time when the nonporous silicon layer has grown to a thickness corresponding to the diameter of the pores of the porous monocrystalline silicon layer.

103 Claims, 8 Drawing Sheets

OTHER PUBLICATIONS

R. Herino et al., "Porosity and Pore Size Distributions of Porous Silicon Layers", *Journal of Electrochemical Society,* vol. 134, No. 8A, Aug. 1987, pp. 1994–2000.

L. Vescan, "Low–Pressure Vapor–Phase Epitaxy of Silicon On Porous Silicon", *Materials Letters,* vol. 7, No. 3, Sep. 1988, pp. 94–98.

C. Oules et al., "Silicon on Insulator Structures Obtained by Epitaxial Growth Of Silicon Over Porous Silicon", *Journal of Electrochemical Society* vol. 139, No. 11, Nov. 1992, pp. 3595–3599.

T. Yonehara et al., "Epitaxial layer transfer by bond and etch back of porous Si", *Applied Physics Letters,* vol. 64, No. 16, Apr. 18, 1994, pp. 2108–2110.

FIG. 3A  PONOUS Si 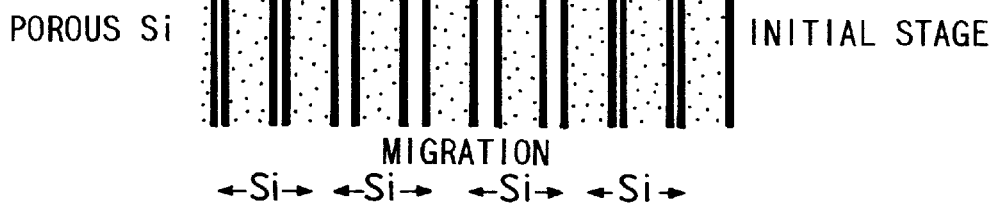 INITIAL STAGE
FIG. 3B  POROUS Si  H₂ BAKING
  AFTER H₂ BAKING
  GROWTH
  EPITAXIAL Si
POROUS Si FIG. 4A  POROUS Si — INITIAL STAGE
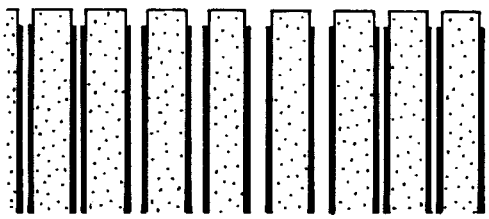
FIG. 4B  POROUS Si — $H_2$ BAKING
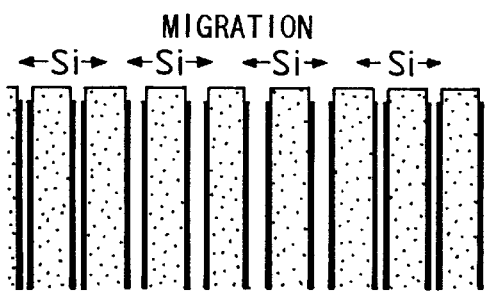
FIG. 4C — AFTER $H_2$ BAKING
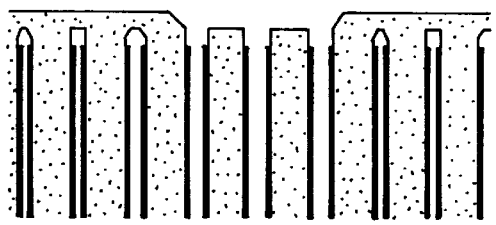
FIG. 4D — INTRODUCTION OF SMALL AMOUNT OF SOURCE GAS (PROMOTION OF MIGRATION)
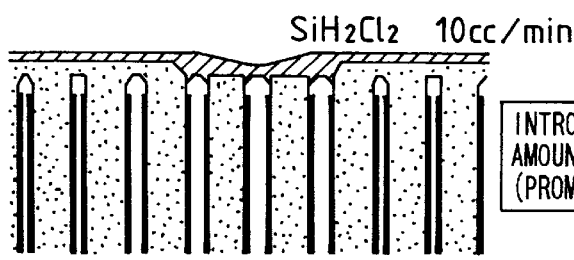
FIG. 4E — GROWTH
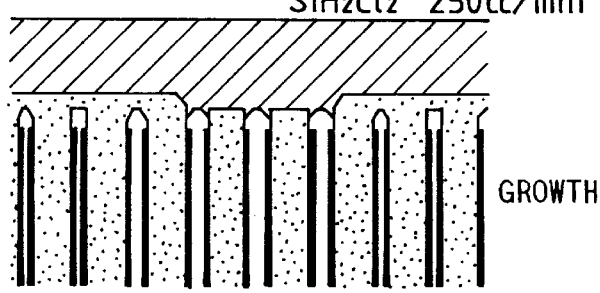

SEMICONDUCTOR SUBSTRATE AND PROCESS FOR PRODUCTION THEREOF

BACKGROUND OF THE INVENTION

1. Field of the Invention

The present invention relates to a semiconductor substrate, and a process for producing the semiconductor substrate. Particularly the present invention relates to a semiconductor substrate such as an SOI substrate and is useful as the base of an integrated circuit employing MOSFET, a bipolar transistor, and the like.

2. Related Background Art

Many studies have been made on silicon-on-insulator (SOI) structure for silicon type semiconductor devices and integrated circuits, because the SOI has low parasite capacitance and facilitates element separation for increased speed, power saving, high degree of integration, and cost reduction of transistors.

In the 1970s, Imai proposed the process for FIPOS (fully isolation by porous silicon) (K. Imai, Solid State Electronics 24 (1981), p.159). In this process, n-type islands are formed on a p-type substrate, and the p-type region including the area below the n-type islands is made selectivley porous, leaving the n-type regions nonporous. The porous silicon, which was discovered by Uhlir et al. in 1964 (A. Uhlir, Bell Syst. Tech. J., 35 (1956), p.333), has pores of several nanometers to several tens of nanometers in the interior of silicon crystal, like a sponge. It has extremely large surface area with a unit volume of several hundreds $m^2/cm^3$ or more. In thermal oxidation in an oxygen-containing atmosphere, the porous silicon is oxidized not only at the surface but also in the interior by the oxygen having penetrated thereto. Therefore, the porous silicon layer can be selectively oxidized. Since the thickness of the oxide film is controlled by thickness of the porous layer rather than the time of the oxidation, the silicon oxide film can be formed on the porous silicon in a thickness of several ten times to several hundred times that formed by bulk silicon oxidation. Thus the porous region can be completely oxidized, leaving the n-type silicon islands not oxidized at all. By this process, silicon islands are formed on oxidized porous silicon to provide FIPOS. Since the volume of silicon increases when oxidized, the porous silicon has preferably a porosity, (pore volume)/(sum of remaining silicon volume and pore volume), of about 56% in order to prevent warpage of the wafer and formation of defects by the volume increase.

Later, an improvement of this process was disclosed, in which a porous silicon layer is formed on the entire surface of monocrystalline silicon, nonporous monocrystalline silicon is epitaxially grown on the porous silicon, a part of the epitaxial silicon layer is removed to bare the porous silicon, and the porous silicon is selectively oxidized to form SOI structure (H. Takei, and T. Itoh, J. Electronic Materials 12 (1983), p.973).

With the development of FIPOS as the application field of porous silicon, the method of growth of nonporous monocrystalline silicon layer was developed taking the application to FIPOS into consideration.

T. Unagami, et al. reported epitaxial growth on porous silicon (T. Unagami, and M. Seki, J. Electrochem. Soc., 125 (1978) p.1340), probably prior to the report on FIPOS process. In Unagami's process, a porous layer is formed on the surface of a p-type Si(111) wafer of resistivity of 0.004 to 0.15 Ωcm, and an epitaxial silicon layer is grown in a hydrogen atmosphere at 1170° C. by employing $SiCl_4$ as the source gas at a growth rate of 0.4 μm/min. In the grown layer, no lamination defect was reported to be observed after Si etching. However, such a high-temperature treatment causes considerable coarsening of porous structure, which is not suitable for production of the FIPOS structure. Accordingly, after the disclosure of the FIPOS, investigation on the epitaxial layer formation have been concentrated on prevention of structure change of the porous silicon and to simultaneous decrease of the crystal defects in the epitaxial layer.

Takai at al. prevented the structure change of the porous silicon by forming a monocrystalline silicon layer at 750° C. by plasma CVD employing $SiH_4$ at a growth rate of 102 to 132 nm/min (H. Takai, and T. Itoh, J. Electronic Materials, 12 (1983) p.973; H. Takai, and T. Itoh, J. Appl. Phys. 60 (1986) p.223). Takai et al. reported that, in formation of epitaxial silicon layer on porous silicon by plasma CVD, the pores of the porous layer comes to be blocked with the increase of the epitaxial silicon layer, and estimated the transition layer having remaining pores to be about 150 nm.

Vescan et al. employed LPVPE (low pressure vapor phase epitaxy) (L. Vescan, G. Bomchil, A. Halimaoui, A. Perio, and R. Herino, Material Letters 7 (1988) p.94). In their method, porous silicon was formed at a porosity of 56% on a p-type Si substrate of resistivity of 0.01 Ωcm, and the pore walls were thinly oxidized at 300° C. for one hour by dry oxidation (preoxidation). This oxidation was conducted for the purpose of preventing coarsening of the structure of the porous layer in the later high-temperature treatment of epitaxial growth and oxidation. Subsequently, the oxidation film only was removed by dipping in HF. The substrate was placed in a growth chamber, and was baked at an ultrahigh vacuum of $5 \times 10^{-6}$ mbar, and thereon a nonporous monocrystalline silicon layer was epitaxially grown by introduction of $SiH_2Cl_2$ at a temperature of not higher than 900° C. A transition net of about $10^5/cm^2$ was found around the interface by observation of the sectional face by transmission electron microscopy. Defects traversing the epitaxial layer were also found.

C. Oules et al. conducted preoxidation and LPVPE by using $SiH_4$ as the source gas in a similar manner as Vescan did (C. Oules, A. Halimaoui, J. L. Regolini, R. Herino, A. Perio, D. Benshahel, and G. Bomchil, Mater. Sci. Eng., B4 (1989) p.435; and C. Oules, A. Halimaoui, J. L. Regolini, A. Perio, and G. Bomchil, J. Electrochem. Soc. 139 (1992) p.3595). They conducted epitaxial growth at 830° C. and 2 Torr by using $H_2$ as the carrier gas and $SiH_4$ as the source gas, at a growth rate of 0.5 μm/min. The crystal defect density in the epitaxial layer on the porous silicon formed on p-type Si substrate of 0.01 Ωcm depended greatly on the porosity of the porous layer. It is shown that at the porosity of 50% or lower the defect density observed by plane TEM was at nearly the same level as that of an epitaxial layer grown under the same conditions on a bulk (nonporous) silicon wafer, but the absolute value thereof is not shown. Usually in plane TEM observation, the size of measurement region for one sample is about 100 μm square. Therefore the detection limit for the defect density is considered to be about $10^4/cm^2$, or in more careful observation to be not less than $10^3/cm^2$. The remaining defects is presumed to be caused by particles caused by the structure of the apparatus. Therefore, the defect density should be further examined under cleaner environmental conditions.

The studies on the FIPOS process were actively conducted from 1970s to the first half of 1980s, but have declined with development of new processes for SOI structures because the formation of the surface silicon layer is limited to island shapes in the FIPOS process, which is not suitable for general purposes.

As described above, the epitaxial growth on porous silicon for the FIPOS process was required to be conducted at a process temperature of not higher than 900° C. in order to prevent coarsening of the porous structure and not to retard the selective oxidation of the porous layer in the later step. Therefore, the epitaxial growth method has been limited to MBE and LPVPE which have not widely been used for semiconductor silicon production. Thus few investigations have been made on the epitaxial growth by a widely used CVD system in which the epitaxial growth is practiced in a hydrogen atmosphere at a pressure of about 10 to 760 Torr by feeding a source gas.

Recently noticed SOI forming techniques include SIMOX (separation by implanted oxygen), and wafer bonding technique. The SIMOX is proposed by Izumi of Nippon Telegraph and Telephone Corporation on 1978, in which oxygen ions are implanted into a silicon substrate, and the substrate is heat-treated at a temperature of higher than 1300° C. to obtain buried silicon oxide film (K. Izumi, M. Doken, and H. Ariyoshi, Electron. Lett. 14 (1978) p.593). In this method the surface silicon layer thickness and the buried silicon oxide layer thickness are limited by control of the defect density and the quality of the oxide film, and the commercial products have a limited surface silicon thickness of 200 nm ±60 nm, and a limited buried oxide thickness of 390 nm. The uniformity of the film thickness is affected by variation of implanting energy for ion implantation. Therefore, sacrificial oxidation, epitaxial growth, or a like treatment is required to obtain a desired thickness of the film. In particular, in thin film formation, the film thickness uniformity tends to be lower. Further, in the buried oxide film, which is formed by coalescence of oxygen ions, pinholes are formed in the portion where the oxygen coalescence is insufficient. The pin holes would cause leakage, or poor dielectric strength.

On the other hand, various methods are disclosed for wafer bonding technology to obtain an SOI structure because of controllability of thicknesses of a surface silicon layer and a buried silicon oxide layer, and high crystallinity of the surface silicon layer. Nakamura et al. disclosed a bonding method in which wafers are bonded together without an adhesive layer or another interlayer (Japanese Patent Publication No. 39-17869). This method was not further investigated until Lasky, et al. reported on 1985 a method of thinning one of the bonded wafer, and the characteristics of MOS transistor formed thereon (J. B. Lasky, S. R. Stiffler, F. R. White, and J. R. Abernathey, Technical Digest of the International Electron Devices Meeting (IEEE, New York, 1985), p.684). In the Lasky's method, an n-type epitaxial silicon layer is formed on a first wafer containing a high concentration of boron. This first wafer and a second wafer having oxide film on the surface, after they are cleaned optionally, are brought into close contact, whereby the two wafers are bonded by Van der Waals force. By heat treatment, covalent bonds are formed between the two wafers to give a bonding strength sufficient for device production. Then the first wafer is etched from the non-bonded face by a mixture of hydrofluoric acid, nitric acid, and acetic acid to remove selectively the p' silicon wafer to leave only the epitaxial silicon layer unetched on the second wafer. In this Lasky's method, it is difficult to leave the epitaxial silicon layer in a uniform thickness on the entire face of the wafer since the ratio of the etching rate of p' silicon to that of the epitaxial (p- or n) silicon is low.

To solve this problem the etching is conducted twice. Onto a face of a silicon wafer of low impurity concentration as a first substrate, were laminated a $p^{++}$ Si layer and a layer of low impurity concentration. This substrate is laminated on a second substrate similar to the aforementioned one. The first substrate is thinned at the non-laminated face by polishing, grinding, or a like mechanical method. Then the remaining first substrate is selectively etched with an etching solution to bare the entire face of the $p^{++}$ Si layer having been buried in the first substrate. For the etching, an alkaline etching solution is employed such as ethylenediamine pyrocatechol, and KOH, whereby the selective etching occurs owing to the difference in the impurity concentration. Then the bared $p^{++}$ Si layer is selectively removed by selective etching with a mixture of hydrofluoric acid, nitric acid, and acetic acid in the same manner as in the above Lasky's method to obtain the second substrate having thereon only a monocrystalline silicon layer of low impurity concentration. In such a method, selective etching is repeated two or more times to improve the overall selectivity and to improve thereby the uniformity of the surface Si layer thickness on SOI.

However, in the thin film formation by selective etching by utilizing the impurity concentration difference or the composition difference of the substrate as mentioned above, the selectivity of the etching is greatly affected by the profile of the impurity concentration in depth direction, as readily anticipated. That is, in heat treatment at a high temperature to strengthen the bonding of the wafers after lamination, the distribution of the impurity of the buried layer broadens to lower the etching selectivity and to deteriorate the uniformity of the layer thickness. Therefore, the heat treatment after the lamination must be conducted at the temperature not higher than 800° C., and further the repeated etching is expected to be not satisfactorily controlled in mass production owing to low selectivity ratio in respective etching steps.

In the above methods, the selectivity of the etching is achieved by difference in impurity concentrations or in impurity compositions. Yonehara, one of the inventors of the present invention, disclosed a novel process therefor in Japanese Patent Laid-Open Application No. 5-21338 (EP Publication No. 0469630-A). The process of Yonehara for preparing a semiconductor member comprises the steps of forming a member having a nonporous monocrystalline semiconductor region on a porous monocrystalline semiconductor region, bonding the surface of a member of which the surface is constituted of an insulating substance onto the surface of the nonporous monocrystalline semiconductor region, and removing the porous monocrystalline semiconductor region by etching. This process utilizes the etching selectivity between a porous monocrystalline semiconductor region and a nonporous monocrystalline semiconductor region, and is suitable for producing an SOI substrate, for example with an active silicon layer having a uniform layer thickness. By this method, a selective etching can be realized with a selectivity factor of as high as 100 thousands owing to the difference in structure of the porous silicon having a large surface area per unit volume of, for example, 200 $m^2/cm^3$ from that of nonporous silicon.

In this process, the selectivity is so high that the uniformity of the epitaxially grown monocrystalline silicon is reflected in the thickness uniformity of the resulting SOI layer without any adverse effects from etching. Therefore, use of a commercial CVD epitaxial growth apparatus realizes the uniformity of the wafer thickness, for example, in the range of from ±4%, or ±2% or less, in an SOI-Si layer. In this process, the porous silicon which is employed in selective oxidation in FIPOS is used as the etched material.

Therefore, the porosity is not limited to about 56%, but a lower porosity of about 20% is rather suitable. Since the porous silicon is not included in the final constituting material, the influences of warpage or distortion is mitigated, and the structure change of porous silicon and coarsening of the pores are acceptable provided that the etching selectivity is not impaired. Therefore, the temperature for the epitaxial growth is not limited to 900° C. or lower. The process for preparing SOI structure disclosed in the aforementioned Japanese Patent Laid-Open Application No. 5-21338 is named ELTRAN by Yonehara (T. Yonehara, K. Sakaguchi, and N. Sato, Appl. Phys. Lett. 64 (1994) p.2108). In this process, the epitaxial growth of nonporous monocrystalline silicon on porous silicon is a very important step, and reportedly under certain growth conditions lamination defect density in the epitaxial silicon layer on the porous silicon can be $10^3$ to $10^4/cm^2$. In the ELTRAN process, the defects in the formed SOI wafer are mainly the lamination defects.

Sato, et al., the inventors of the present invention, conducted epitaxial growth on the porous layer for ELTRAN by CVD (chemical vapor deposition) in a hydrogen atmosphere by using $SiH_2Cl_2$ as the source gas (N. Sato, K. Sakaguchi, K. Yamagata, Y. Fujiyama, and T. Yonehara, Proc. of the Seventh Int. Symp. on Silicon Mater. Sci. and Tech., Semiconductor Silicon (Pennington, The Electrochem. Soc. Inc., 1994) p.443). The prebaking temperature was 1040° C., and the crystal growth temperature was 900 to 950° C., which were higher than those in conventional FIPOS. However, the coarsening of the porous silicon layer structure was nearly completely prevented by preoxidation (400° C., one hour, in OZ). They showed that the defects caused in the epitaxial layer were mainly lamination defects and, for decrease of the lamination defects, hydrogen prebaking prior to the growth in the epitaxial growth furnace is effective to decrease the number of pores on the surface of the porous silicon by four orders of magnitude (from $10^{11}/cm^2$ down to $10^7/cm^2$ or less). HF dipping immediately before the introduction of the substrate into the epitaxial growth furnace to decrease of the oxygen concentration in the vicinity of surface of the porous layer. By lengthening the time of HF dipping, the lamination defect density was lowered in the epitaxial silicon layer on the porous silicon to the level of $10^3-10^4/cm^2$, with a certain lower limit. On the other hand, it was suggested that the remaining pores on the surface of the porous silicon after the hydrogen prebaking become the seeds of the lamination defects. The growth rate was generally higher than 100 nm/min. Generally, the lamination defects are considered to possibly deteriorate the dielectric strength of the oxide layer. The rearrangement around the lamination defects increases leakage current in p-n junction to deteriorate the life time of the minority carrier, which is considered generally to be caused only when metal impurity exists in the rearrangement portion. Although many reports have been disclosed on the epitaxial growth on the aforementioned porous layer, no report is found which shows the crystal defects of less than $10^3/cm^2$ even by more sensitive detection by defect-revealing etching and optical microscope observation. Although the probability of appearing the lamination defects of $10^3-10^4/cm^2$ in a gate region of 1 $\mu m^2$ is as low as about 0.0001 to 0.00001, the defect density is high in comparison with a bulk silicon wafer, which can generally affect the yield of integrated circuits. Accordingly, the lamination defect density is desired to be further decreased.

For the crystal growth, epitaxial growth method by CVD is desired which employs a source material diluted with hydrogen and is capable of achieving thickness uniformity of the epitaxial silicon layer within ±4%, or more preferably within ±2%. By use of a usual commercial CVD epitaxial growth apparatus, the equipment investment can be lowered and the apparatus development cost can be reduced. The use of CVD epitaxial growth apparatus is convenient since it can readily enlarge the wafer size (6 inches to 8 inches).

On the other hand, it was shown that lengthening of the time of HF dipping just before introduction into the growth furnace is effective for decrease of the crystal defect density. However, in the HF dipping, the HF solution may penetrate locally into the deep interior of the porous silicon to remove the thin oxide film formed by preoxidation on the pore walls. This causes local coarsening of porous silicon, which retards removal of porous silicon by selective etching to leave the porous silicon in an island state. Therefore, a method has been desired which decreases crystal defects in the epitaxial silicon layer on the porous silicon in the CVD method by which a film can be formed with satisfactory layer thickness distribution by feeding a source gas diluted with hydrogen.

In the aforementioned method in which an epitaxial silicon layer is laminated on a porous silicon and the porous layer is removed by etching, any pinhole in the thin epitaxial silicon layer may cause penetration of the etching solution into the lamination interface. This may cause etching of the buried silicon oxide to form voids. In the resulting void portion, where no buried oxide film is present, failure of a device like a MOS transistor may result owing to instability of the underlying interface.

SUMMARY OF THE INVENTION

An object of the present invention is to provide a process for producing a semiconductor substrate having a porous silicon layer and an epitaxial silicon layer having less crystal defects formed thereon.

Another object of the present invention is to provide a process for producing a semiconductor substrate in which an epitaxial silicon layer is grown on a porous silicon layer in an appropriate growth rate with fewer crystal defects.

A further object of the present invention is to provide a process for producing a semiconductor substrate in which an epitaxial silicon layer is grown on a porous silicon layer in a uniform layer thickness with less crystal growth.

A still further object of the present invention is to provide a semiconductor substrate applicable to an SOI substrate which has an epitaxial silicon layer having a uniform thickness and less defect density and a buried oxide film having excellent characteristics.

According to a first embodiment of the present invention, there is provided a process for producing a semiconductor substrate having a porous monocrystalline silicon layer and a nonporous monocrystalline silicon layer grown thereon, wherein the nonporous monocrystalline silicon layer is grown at a low growth rate controlled such that the density of remaining pores on the crystal growth face is not more than $1000/cm^2$ at the time when the nonporous monocrystalline silicon layer has grown to a thickness corresponding to the diameter of the pores of the porous monocrystalline silicon layer.

According to a second embodiment of the present invention, there is provided a process for producing a semiconductor substrate having a porous monocrystalline silicon layer and a nonporous monocrystalline silicon layer grown thereon, wherein the nonporous monocrystalline silicon layer is grown first at a low growth rate controlled such that the density of remaining pores on the crystal growth face is not more than $1000/cm^2$ at the time when the nonporous monocrystalline silicon layer has grown to a thickness corresponding to the diameter of the pores of the porous monocrystalline silicon layer, and thereafter the nonporous monocrystalline silicon layer is grown at an increased growth rate.

According to a third embodiment of the present invention, there is provided a process for producing a semiconductor substrate comprising providing a first member having a porous monocrystalline silicon layer and a nonporous monocrystalline silicon layer grown thereon, laminating the nonporous silicon layer of the first member onto a second member with interposition of an insulation layer provided on at least one lamination face of the first member and the second member, and removing the porous monocrystalline silicon layer by etching, wherein the nonporous monocrystalline silicon layer is grown at a low growth rate controlled such that the density of remaining pores on the crystal growth face is not more than $1000/cm^2$ at the time when the nonporous silicon layer has grown to a thickness corresponding to the diameter of the pores of the porous monocrystalline silicon layer.

According to a fourth embodiment of the present invention, there is provided a process for producing a semiconductor substrate comprising providing a first member having a porous monocrystalline silicon layer and a nonporous monocrystalline silicon layer grown thereon, laminating the nonporous monocrystalline silicon layer of the first member onto a second member with interposition of an insulation layer provided on at least one lamination face of the first member and the second member, and removing the porous monocrystalline silicon layer by etching, wherein the nonporous monocrystalline silicon layer is grown at a low growth rate controlled such that the density of remaining pores on the crystal growth face is not more than $1000/cm^2$ at the time when the nonporous monocrystalline silicon layer has grown to a thickness corresponding to the diameter of the pores of the porous monocrystalline silicon layer, and thereafter the nonporous monocrystalline silicon layer is grown at an increased growth rate.

The present invention further relates to a semiconductor substrate produced by the process for producing a semiconductor substrate.

According to a fifth embodiment of the present invention, there is provided a semiconductor substrate having a porous monocrystalline silicon layer and a nonporous monocrystalline silicon layer formed thereon, the nonporous monocrystalline silicon layer having crystal defects in a crystal defect density of less than $1000/cm^2$.

According to a sixth embodiment of the present invention, there is provided a semiconductor substrate having an insulation layer and a nonporous monocrystalline silicon layer formed thereon, the nonporous monocrystalline silicon layer having crystal defects in a crystal defect density of less than $1000/cm^2$ and layer thickness uniformity within ±4%.

The present invention enables reduction of defect density in the nonporous monocrystalline silicon crystal to about $1000/cm^2$ by controlling the growth rate of nonporous silicon layer to be low so as not to cause nuclear formation.

Further in the present invention, the growth is controlled to be at a low rate to avoid nucleus formation in an initial period of the growth, and thereafter the growth is allowed to proceed in a conventional manner at a usual rate, and yet the crystal defects are reduced. The reduction of the crystal defects, decrease of the boron concentration, and prevention of coarsening of the porous structure are simultaneously achieved by the initial growth of nonporous monocrystalline silicon at a low rate to avoid nucleus formation and subsequent growth for layer thickness at a low temperature.

Further in the present invention, the surface roughness of the epitaxial silicon layer on the porous silicon layer is reduced, thereby bonding strength of the laminate is increased and occurrence of local defective bonding is decreased significantly. Furthermore, in the growth at a low rate to avoid nucleus formation, the introduced atoms diffuse on the surface more rapidly than the growth, whereby occurrence of pinholes caused by fine foreign materials is prevented.

By the process for producing a semiconductor substrate of the present invention, an SOI substrate can be prepared which has an SOI structure having a crystal defect density of less than $1000/cm^2$ with few voids caused by pinholes at the interface of bonding without pinholes in the buried oxide film.

The SOI substrate produced by the process of the present invention has a low defect density and uniform layer thickness, and has no pinholes in the buried oxide layer, which is different from SIMOX. This is because the heat oxidation film formed on the second member can be employed as a buried insulation layer in the SOI structure.

BRIEF DESCRIPTION OF THE DRAWINGS

FIGS. 3A to 3E illustrate steps of an epitaxial silicon layer formation on a porous silicon in a conventional method.

FIGS. 4A to 4E illustrate steps of an epitaxial silicon layer formation on a porous silicon according to the present invention.

DESCRIPTION OF THE PREFERRED EMBODIMENTS

The process of the present invention is characterized in that the nonporous monocrystalline silicon layer is grown initially at an extremely low growth rate on a porous monocrystalline silicon layer. The process for producing a semiconductor substrate of the present invention is applicable to production of an SOI substrate. Since a high quality SOI substrate is in wide demand, the present invention is explained below on the basis of the studies made by the inventors of the present invention on the production of an SOI substrate.

The process for producing an SOI substrate studied by the inventor comprises steps of making a monocrystalline silicon substrate porous, epitaxially growing a monocrystalline silicon on the porous silicon layer, laminating the substrate having thereon an epitaxial monocrystalline silicon film onto another substrate, and removing the porous silicon layer. An example of the process for producing such an SOI substrate is described by reference to FIGS. 7A to 7E and FIGS. 10A and 10B.

Figure 7A:
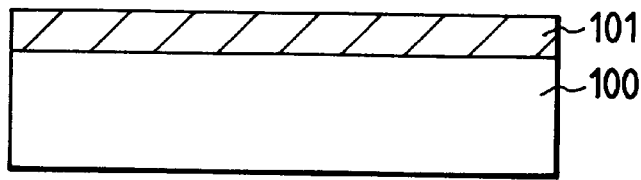
FIGS. 7A to 7E illustrate schematically examples of the process for producing the semiconductor substrate of the present invention.

A monocrystalline silicon substrate 100 is anodized to form a porous silicon 101 (FIG. 7A). The thickness of the porous silicon layer may be several to tens of angstroms on one face of the substrate. Otherwise, the entire silicon substrate 100 may be anodized.

Figure 7B:
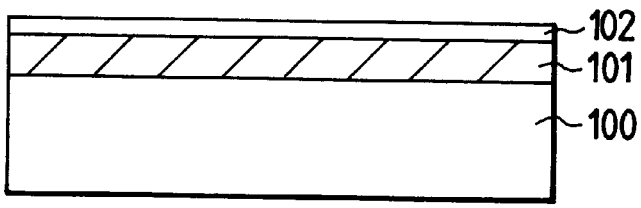
Figure 10A:
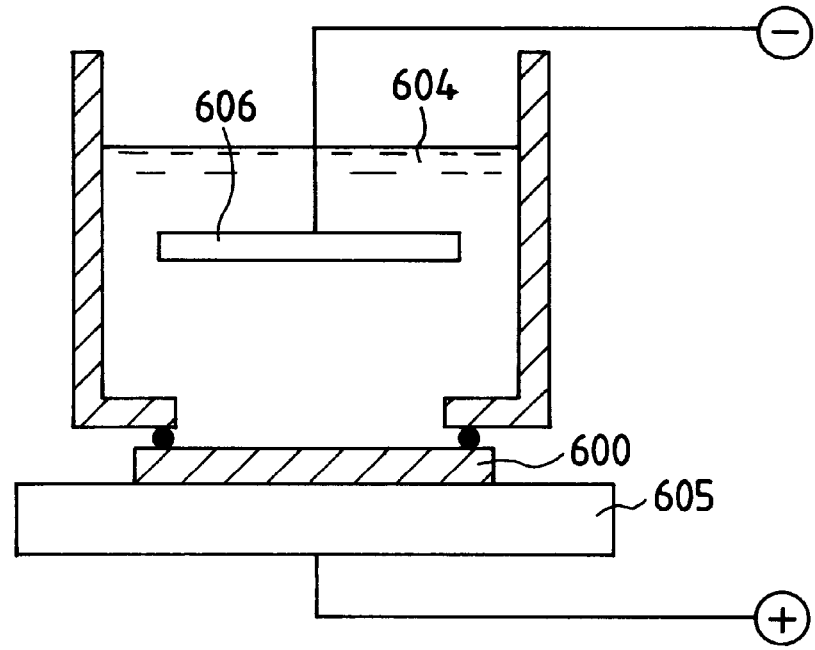
FIGS. 10A and 10B illustrate schematically examples of the anodization apparatus.
Figure 10B:
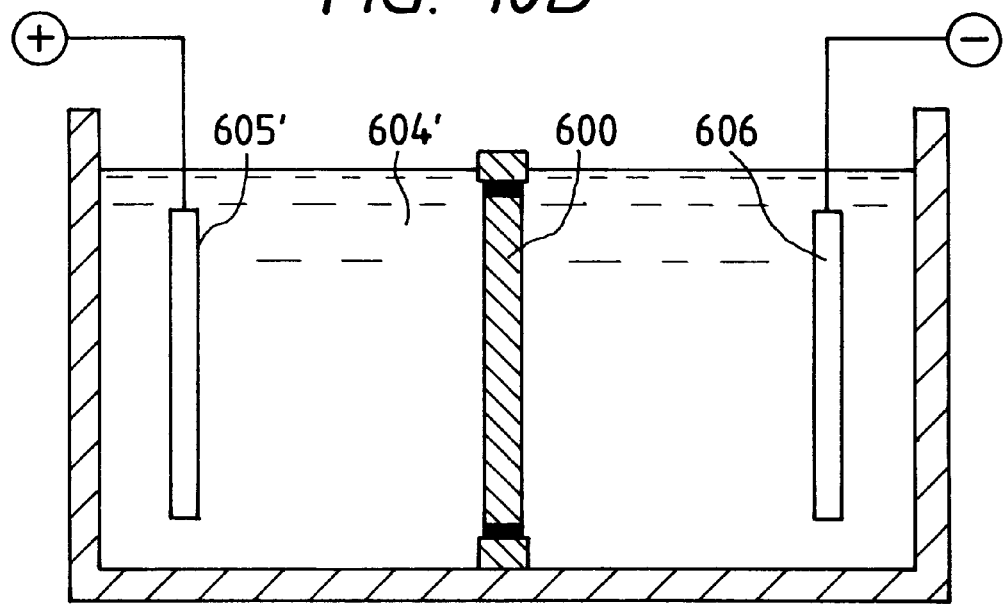

The process for forming porous silicon is described by reference to FIGS. 10A and 10B. A P-type monocrystalline silicon substrate 600 is employed as the substrate. If an N-type one is used, it is limited to the one having a low resistance, or to be used under light irradiation to accelerate the hole formation. The substrate 600 is set on the apparatus shown in FIG. 10A such that one face of the substrate is in contact with a hydrofluoric acid type solution in which a negative electrode 606 is provided and the other face of the substrate is in contact with a positive metal electrode. Otherwise, the positive electrode 605' may be electrically connected through a solution 604' with the substrate as shown in FIG. 10B. In any way, porosity formation is caused on the face in contact with a hydrofluoric acid type solution at the negative electrode side. The hydrofluoric acid type solution 604 is usually a concentrated hydrofluoric acid solution (49% HF). Dilution of the concentrated hydrofluoric acid with pure water is not preferred since etching will occur at a concentration lower than a certain level depending on the applied electric current. Bubbles which are formed on the surface of the substrate 600 during the anodization can be removed effectively by addition of an alcohol as a surfactant. The alcohol includes methanol, ethanol, propanol, and isopropanol. Instead of adding the surfactant, the solution may be stirred by a stirrer during the anodization. The negative electrode 606 is made of a material resistant to the hydrofluoric acid solution such as gold (Au) and platinum (Pt). The positive electrode 605, which may be made of a generally used metallic material, is preferably coated on the surface with a metal film resistant to the hydrofluoric acid since the hydrofluoric acid solution 604 reaches the positive electrode 605 if the entire of the substrate 600 has come to be anodized. The electric current intensity for the anodization is not more than several hundred $mA/cm^2$, but is more than zero. The current intensity is selected within such a range that the epitaxial growth will occur satisfactorily on the external face of the formed porous silicon layer. Generally, at the higher intensity of the current, the anodization proceeds at the higher rate and the formed porous silicon layer has a lower density with a larger pore volume. Thereby the epitaxial growth conditions are varied. On the porous layer 101 formed as above, a nonporous monocrystalline silicon layer 102 is allowed to grow epitaxially (FIG. 7B).

The method for forming the nonporous monocrystalline silicon layer is the important point of the present invention, and is described later in detail.

Figure 7C:
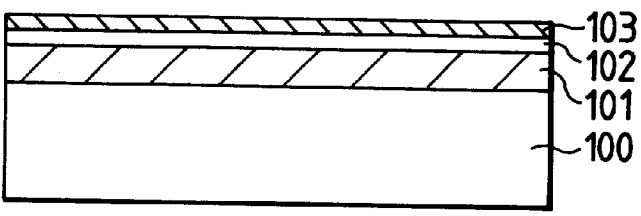

Then the surface of the epitaxial layer 102 is oxidized to form an $SiO_2$ layer 103 (FIG. 7C). (The oxidation process includes thermal oxidation.) If the epitaxial layer is laminated directly to the supporting substrate in the subsequent step, impurities are liable to segregate at the lamination interface, and dangling bonds of the atoms at the interface tends to increase to render unstable the properties of the resulting thin film device. Therefore, this surface oxidation is conducted to offset the above disadvantages. This oxidation step is not dispensable, and may be omitted by employing a device construction in which no trouble is caused by the above phenomena. The $SiO_2$ layer 103 serves as an insulation layer of the SOI substrate. The insulation layer should be formed on at least one face of the substrates to be laminated together. The insulation film can be formed in various ways. The oxidation film, when it is formed, is controlled to have a thickness sufficient to prevent contamination of the lamination interface from the external air.

Separately from the above substrate 100 having the oxidized epitaxial face, a supporting substrate 110 is provided which has an $SiO_2$ layer 104 on the surface thereof. The supporting substrate 110 is exemplified by a silicon substrate which has been oxidized at the surface (including thermally oxidized one), quartz glass, crystallized glass, any substrate onto which $SiO_2$ has been deposited. A silicon substrate may be used which does not have the $SiO_2$ layer 104.

Figure 7D:
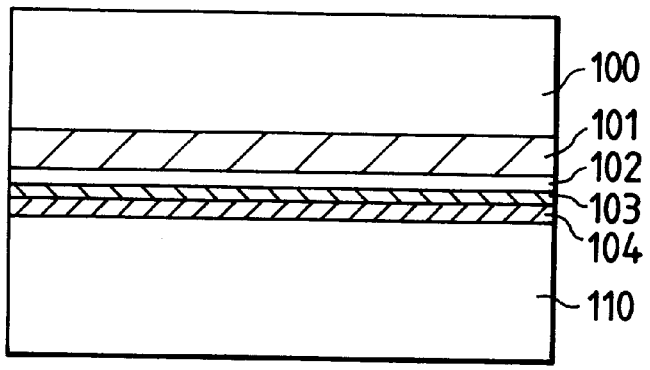

The above two substrates, after cleaning, are laminated together (FIG. 7D). The cleaning is conducted similarly as in usual cleaning of a semiconductor substrate (for example, cleaning prior to the oxidation).

Pressurization on the entire face of the substrate after the lamination is effective for strengthening the lamination bonding.

The laminate of the substrates is heat-treated. A higher temperature is preferred for the heat treatment. However, an excessively high temperature can cause structural change of the porous layer 101, or diffusion of an impurity from the substrate to the epitaxial layer. Therefore, the temperature and the heating time are selected such that the above disadvantages are not caused. Specifically, the treatment temperature is preferably in the range of from about 600° C. to 1100° C. Some substrates are not capable of enduring heat treatment at a high temperature. For example, a quartz glass as the substrate 110 is required to be treated at a temperature lower than about 200° C. because of the difference of the thermal expansion coefficient of quartz from that of silicon. Above that temperature, the laminated substrates may come to be separated or cracked by stress. The substrates after the heat treatment are required only to be resistant to the stresses in polishing or etching of the bulk silicon 100 in the subsequent step. Therefore, the process can be conducted by optimizing the surface treatment conditions for the activation even at a temperature of 200° C. or lower.

Figure 7E:
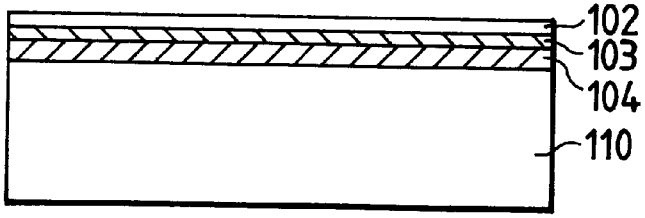

Subsequently, the silicon substrate portion 100 and the porous layer portion 101 are selectively removed, leaving the epitaxial growth layer 102 unremoved (FIG. 7E). Thus an SOI substrate has been prepared.

In addition to the above-described steps, the steps below may further be conducted.

(1) Oxidation of inner pore walls in porous layer (preoxidation)

In the porous silicon layer, the walls between the adjacent pores are extremely thin in a thickness range of from several nanometers to tens of nanometers. The extremely thin pore walls may coalesce to form thick walls and block the pores in high temperature treatment of the porous layer such as in epitaxial silicon layer formation, and heating after substrate lamination, thus lowering the etching rate. The thickening of the pore walls and coarsening of the pores can be retarded by forming a thin oxide film on the pore walls subsequent to the porous layer formation. However, the oxidation should be limited to be at the surface of the inner walls of the pores to keep the monocrystallinity in the interior of the pore walls because the nonporous monocrystalline silicon layer is to be grown epitaxially thereon. The thickness of the formed oxide film ranges preferably from several angstroms to tens of angstroms. Such thickness of the oxide film is formed by heat treatment in an oxygen atmosphere at a temperature ranging preferably from 200° C. to 700° C., more preferably 250° C. to 500° C.

(2) Hydrogen baking:

It was shown by the inventors of the present invention in EP 553852A2 that fine irregularity of a silicon surface can be removed by heat treatment in a hydrogen atmosphere to give extremely smooth silicon surface. This baking in a hydrogen atmosphere is applicable also in the present invention. For example, the hydrogen baking can be conducted after porous silicon layer formation and before epitaxial silicon layer formation. Otherwise, the hydrogen baking may be conducted for SOI substrate obtained by removal of the porous silicon layer by etching. In the hydrogen baking conducted prior to the epitaxial silicon layer formation, the silicon atoms constituting the surface of the porous silicon migrate to block the outermost portion of the pores. With the pores blocked at the outermost portion, the epitaxial silicon layer will be formed with less crystal defects. On the other hand, in hydrogen baking after the etching removal of the porous silicon layer, the epitaxial silicon surface roughened somewhat by etching is smoothened, and boron incorporated unavoidably in the bonding operation from the clean room into the lamination interface is driven off.

The cause of occurrence of crystal defects in the epitaxial silicon layer on the amorphous silicon grown by CVD or the like method is not known. However, the primary factor for introduction of the lamination layer defects is considered to be the growth on the porous layer, since such introduction of the crystal defects is not observed in an epitaxially grown layer on a bulk wafer under the same conditions. It is reported that after hydrogen pre-baking and prior to the epitaxial growth, the pores still exist although blocking of pores is observed. Therefore, the remaining pores on the surface of the porous layer are presumed to be concerned with the introduction of the lamination layer defects.

Homoepitaxial growth of silicon on bulk silicon by CVD with introduction of a hydrogen-diluted source gas is widely conducted as the essential technique in the silicon semiconductor process. By this technique, the layer thickness can be controlled within the range of ±4%, or preferably ±2% on the entire face of the wafer. In the research on epitaxial growth by CVD, the effort for the development is focused on formation of epitaxial layer in several microns by lowering the growth temperature to prevent autodoping of an impurity, or increasing the growth rate. Therefore, few reports are presented on the growth at a rate of 50 nm/min or less which is conducted in epitaxial growth on porous silicon.

Figure 1:
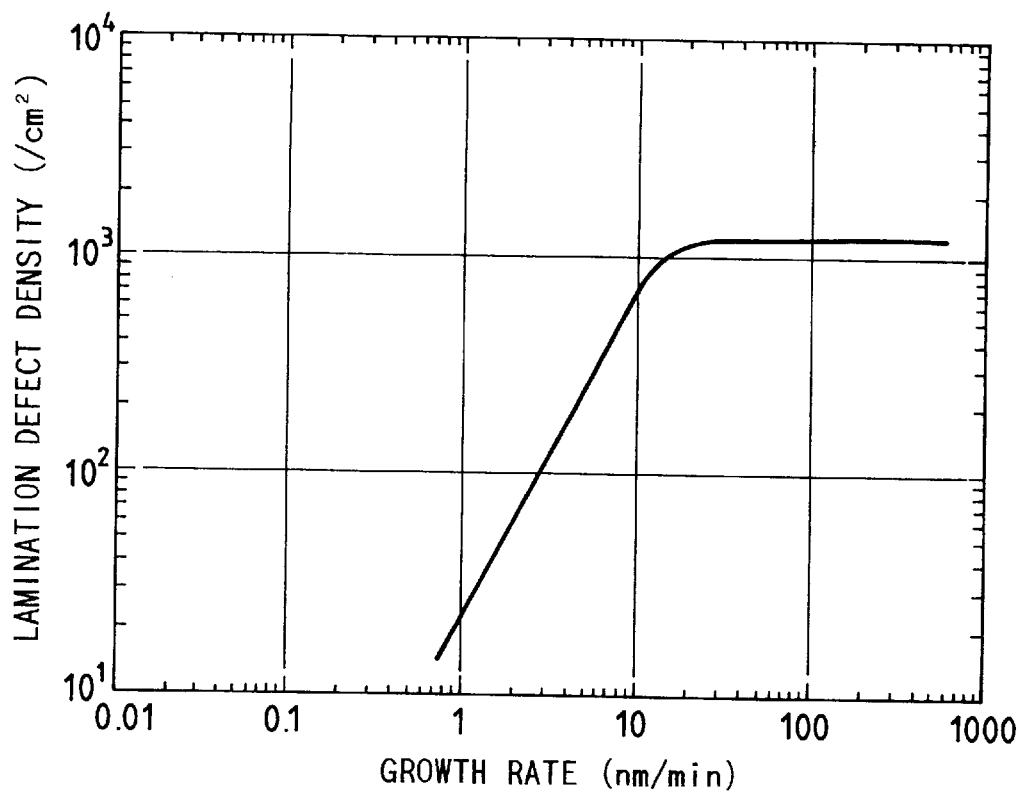
FIG. 1 shows dependency of the lamination defect density on the growth rate.

It was found by the inventors of the present invention, after comprehensive experiments, that the growth rate and the temperature at the initial stage of the epitaxial growth are important factors in decreasing the defects. FIG. 1 shows the experimental results on epitaxial growth of silicon on porous silicon by means of a commercial epitaxial growth furnace with $SiH_2Cl_2$ diluted with $H_2$: dependence of lamination layer defects on the growth rate at the initial stage of epitaxial growth. In the experiments, the growth was allowed to proceed at a temperature of 1150° C. under an atmospheric pressure. The lamination layer defect density became lower rapidly with decrease of the growth rate from 20 nm/min. The lamination layer defects were decreased by a factor of ⅓, or by two orders of magnitude under certain conditions in comparison with that of conventional high growth rate systems. This is probably due to the fact that, at a growth rate lower than a certain value, the surface diffusion of Si atoms adsorbed on the surface of the porous silicon is more likely than increase of the layer thickness, and the ratio of atoms increases which are incorporated into the lattice at the remaining pore portion. In the hydrogen pre-baking prior to the epitaxial silicon growth, pore blocking proceeds on the surface of the porous layer by diffusion of atoms constituting the surface. As a result, most of the pores disappeared. These pores had existed in a diameter of several nanometers to several tens of nanometers at a density of about $10^{11}/cm^2$ and were detectable before the hydrogen pre-baking by high resolution scanning electron microscopy. The detection limit therefor was about $10^7/cm^2$. Simultaneously, the blocked pore portions were flattened by hydrogen baking, and atom steps characteristic to a (2×1) surface structure became observable. To confirm the existence of remaining pores, the substrate immediately after the hydrogen pre-baking was taken out from the furnace, and set in a Roadlock type vacuum chamber, and was subjected to ultrahigh vacuum. The pressure decrease rate was significantly low in comparison with a bulk silicon wafer having no porous layer. Similarly, porous silicon not having been subjected to hydrogen prebaking, and a substrate having a 2-μm epitaxial layer on a porous layer were subjected to the same test. The time for reaching the vacuum attained with the bulk silicon wafer was in the order shown below:

Porous silicon (prebaked)>Porous silicon (not prebaked) >>Porous silicon with epitaxial layer (2 μm)=Bulk silicon.

Figure 2:
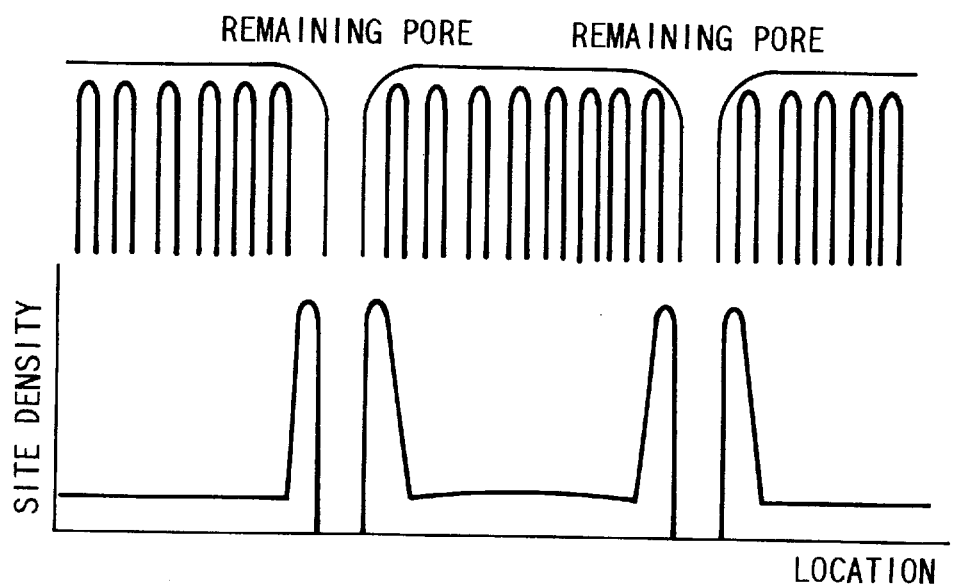
FIG. 2 illustrates schematically a sectional view of a porous silicon having been heat-treated in hydrogen, and distribution of the adsorption site density at the surface.
Figure 3C:
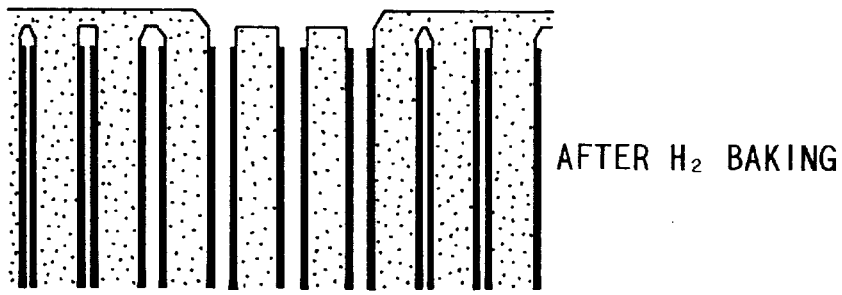
Figure 3D:
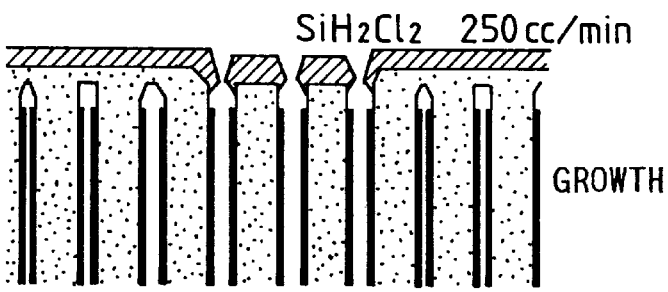
Figure 3E:
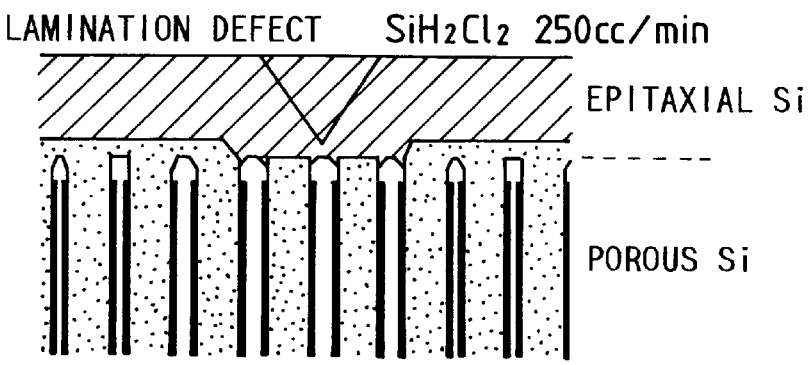

Therefore, pores are considered to be still remaining on the porous silicon after the hydrogen prebaking. FIGS. 3A to 3E illustrate schematically the process of blocking of the pores on the surface by hydrogen prebaking. On the site from which the pores have disappeared, flattening of the surface proceeds by hydrogen baking to form atomic steps characteristic to (2×1) surface structure. FIG. 2 shows distribution of density of the adsorption sites such as steps and kinks on the surface. The site density is extremely high locally around the remaining pores. This is due to the many faces appearing continuously in accordance with the curvature of the bared silicon surface at the remaining pore portions.

In the growth by introduction of the atoms constituting the growing layer onto the surface, when the amount of the introduced atoms is large, the introduced atoms collide with each other on the terrace to form dimers before reaching the steps. The dimers on the surface are far less mobile than the monomers to form nuclei for adsorption site for the introduced atoms. Thereby, density of the effective steps (or adsorption sites) increases, and consequently most of the introduced atoms come to be incorporated into the lattice without surface diffusion. Therefore, the distribution of the probability of incorporation of the introduced atoms into the crystal lattice is small within the plane, so that at the remaining pore portions, layer thickness increases at the remaining pore portion before disappearance of the pores, thereby the crystal lattice tending to become incommensurate and to cause defects. FIGS. 3A to 3E illustrate schematically the above process. In FIG. 1, in the growth rate range in which the lamination defect density is constant independently of the growth rate, the growth proceeds through the above mechanism. In the case where the nuclei are formed, the lamination defect density depends on the remaining pore density just before the growth.

On the other hand, when the amount of the introduced atoms is less, the growth is considered to proceed through two-dimensional growth only from the step sites. Assuming that the distance of the surface diffusion of the introduced Si atoms is sufficiently larger than the average breadth of the terrace between the steps in the portions other than the remaining pore portions, the introduced Si atoms reach the terrace to be incorporated into the steps. When the atoms are introduced onto the surface having distribution of the adsorption site density as shown in FIG. 2, the introduced Si atoms will diffuse on the surface to be incorporated into many adsorption site (steps) around the remaining pores with a remarkably high probability. In other words, the remaining pore portions will function as sinks for the atoms diffusing on the surface, whereby most of the introduced atoms are consumed for blocking of the remaining pores without increase of the layer thickness, pores finally disappearing without formation of defects. As described above, the remaining pores can be blocked without formation of defects, in the early stage of the epitaxial growth process, by introducing such a small amount of the film-constituting atoms or a source gas that nuclear formation is not caused on the porous Si surface. After that, the crystal growth can be practiced in the same manner as in usual growth on bulk silicon without limitation of feed of starting material to the surface. FIGS. 4A to 4E illustrate schematically the process of the growth. In FIG. 1, the rapid decrease of the lamination defects with decrease of the growth rate is caused by blocking of the remaining pores by this mechanism. The prebaking before the growth is not necessarily essential, provided that no natural oxide film is present on the porous silicon surface. The natural oxidation film may be removed by baking in ultrahigh vacuum or etching with hydrochloric acid or the like. That is, the oxide film on the surface has only to be removed in any way, even when the remaining pore density is not reduced by hydrogen prebaking.

After starting the feed of atoms for the growing film, the hydrogen gas is effective for prevention of reoxidation of the surface. An oxygen atom deposited on the growing surface serves as the nucleus of the film growth to reduce the surface diffusion distance. For prevention of the reoxidation and increase of surface diffusion distance, effective is elevation of the growth temperature. When hydrogen is used as the diluent of the source material, the growth temperature is preferably not lower than 800° C., more preferably not lower than 900° C. depending on the pressure. The above effect was not significant below that temperature.

Figure 5:
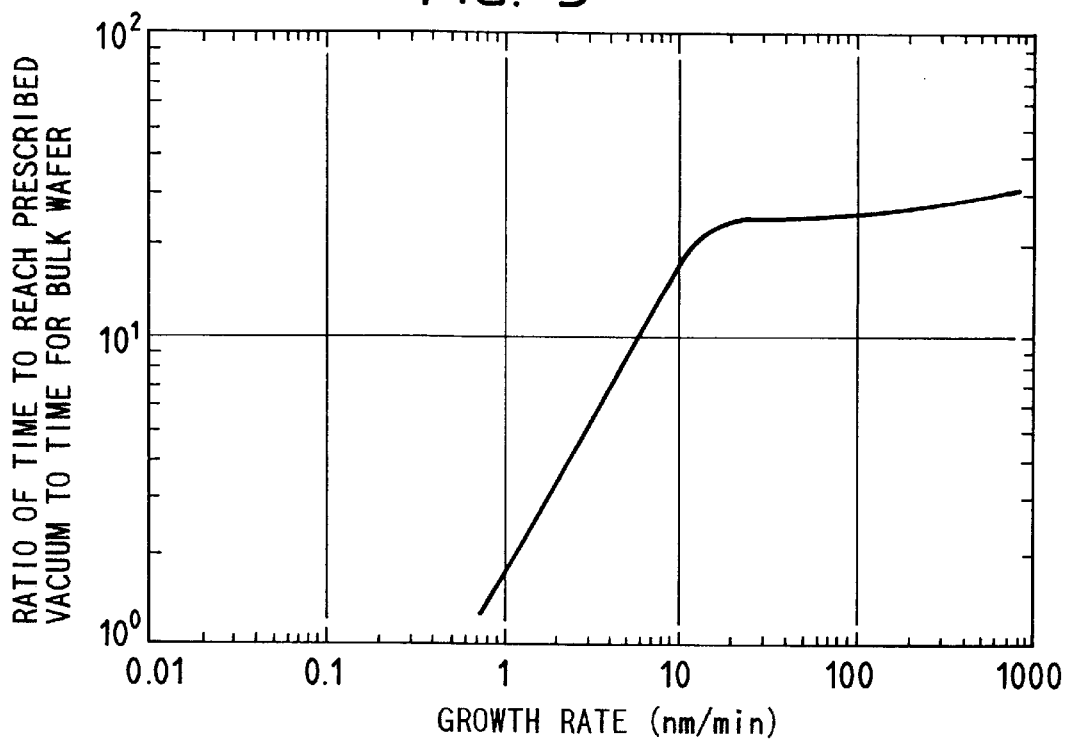
FIG. 5 shows the time for reaching the prescribed vacuum of monocrystalline silicon layer grown to a thickness corresponding to the largest pore diameter as a function of growth rate.

The inventors of the present invention investigated the dependency of the remaining pore density on the growth rate as shown in FIG. 5. On porous silicon, monocrystalline silicon layers were grown epitaxially at various growth rate to a thickness of the largest pore diameter of the pores of the porous silicon. The porous silicon sample was placed in a ultrahigh vacuum chamber, and the time for obtaining a prescribed vacuum was measured for each porous silicon sample. In this experiment, the largest pore diameter was assumed to be the sum of the average pore diameter and 3 times the standard deviation of the pore diameter determined by a gas adsorption method. However, the largest diameter may be determined by practical measurement. The method of measurement of the pore diameter by gas adsorption is described by R. Herino (R. Herino, G. Bomchil, K. Barla, C. Bertrand, and J. L. Ginoux, J. Electrochem. Soc. 134 (1987) p.1994). With the decrease of the growth rate from 20 nm/min, the time for pressure decrease becomes shorter rapidly. By comparing FIG. 5 with FIGS. 4A to 4E, it is clear that at a lower growth rate, without increasing the film thickness, the remaining pores have come to be blocked after the hydrogen prebaking, and correspondingly the crystal defect density in the epitaxial layer is decreased. Thus clearly, the remaining pore density after the ultrathin film formation depends largely on the growth rate.

The pore density of the porous silicon can be measured by ultrahigh resolution scanning electron microscopy, or gas adsorption. However, these methods are not always satisfactory in measurement accuracy for pores of fine diameter and low pore density. In the present invention, the remaining pore density was measured as described below for the sample after ultrathin epitaxial layer formation to measure the density of pores which are not readily detected by ultrahigh resolution scanning microscopy:

(1) A sample is immersed in a mixture of ammonia and aqueous hydrogen peroxide solution, or a mixture of hydrogen chloride and aqueous hydrogen peroxide solution at a temperature ranging from about 50° C. to about 100° C. to make the surface hydrophilic. Any chemical may be used which is capable of making the surface hydrophilic.

(2) The sample is immersed in pure water. The pure water penetrates from the pore remaining on the surface into the interior of the porous layer by capillarity. The pores of the porous silicon extend not only vertically from the surface but also laterally in a complicated fashion, and the penetrating water runs vertically and laterally. The water may be at room temperature, but is preferably heated. The time of immersion is preferably one minute or longer, more preferably 5 minutes or longer, but is not limited thereto.

(3) The sample is taken out from the pure water, and is oxidized by thermal oxidation at a temperature of preferably not lower than 400° C., more preferably not lower than 800° C. The oxide film of a thickness of 10 nm is sufficient. An unnecessarily large thickness thereof in comparison with the epitaxial layer may cause warpage of warpage of the sample to obstruct the subsequent observation.

In the oxidation treatment, the water having penetrated into the sample vaporizes out of the remaining pores with elevation of the temperature of the sample. Although the process of vaporization may compete with the process of oxidation of the porous layer, the oxidation can be made predominant by selection of the temperature in the above range. Consequently, the porous silicon is preferentially oxidized at the portions where water has penetrated. These portions are found to be readily observable by surface morphology or contrast by light interference by optical microscopy.

Figure 6:
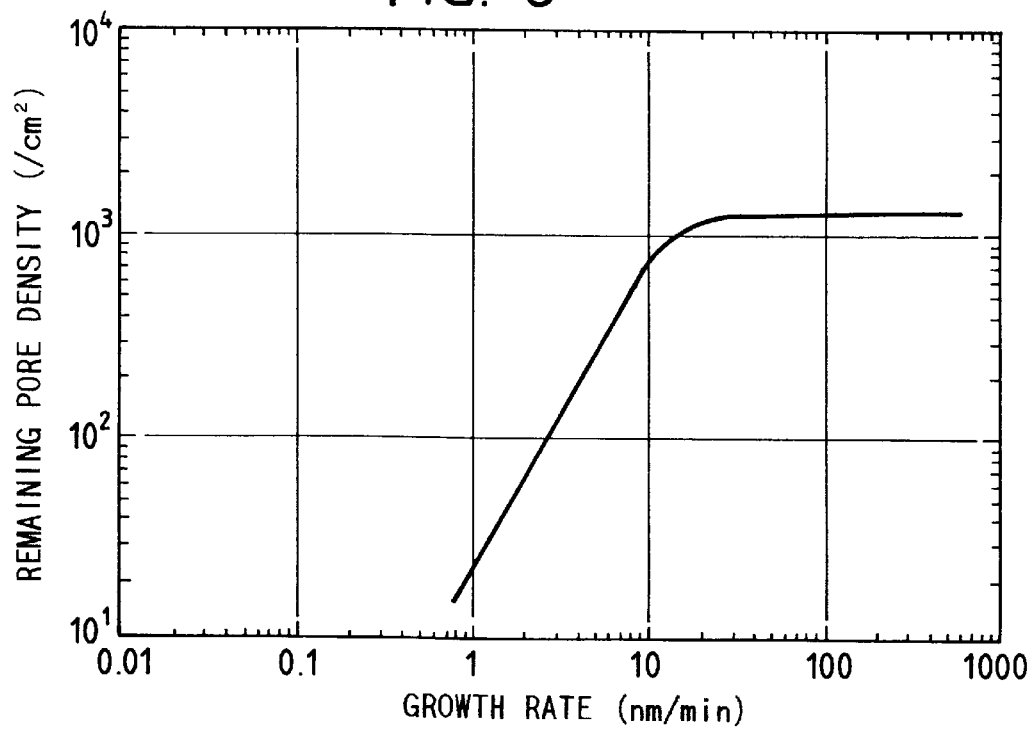
FIG. 6 shows the remaining pore density as a function of the growth rate.

Thus the low density of the remaining pores in the porous silicon is measurable by the above method. FIG. 6 shows the dependency of the remaining pore density on the growth rate of the ultrathin epitaxial silicon layer for the sample on which the epitaxial silicon layer is grown to a thickness corresponding to the largest pore diameter of the porous silicon. The remaining pore density decreases rapidly with decrease of the growth rate from about 20 nm/min as shown in FIG. 6. It is understood from comparison of FIG. 1 with FIG. 6 that the remaining pore density correlates with the lamination layer defects in the ultrathin film region. At the remaining pore density of less than 1000/cm$^2$, the lamination layer defect density is found to be less than 1000/cm$^2$. In other experiments also, the crystal defects in the epitaxial layer was less than 1000/cm$^2$ in the sample having a remaining pore density of less than 1000/cm$^2$, when the epitaxial silicon layer is grown to a thickness corresponding to the largest pore diameter of the porous silicon although the growth temperature, growth gas, and other growth conditions were different. In the experiments also, the largest pore diameter was assumed to be the sum of the average pore diameter and 3 times the standard deviation of the pore diameter determined by a gas adsorption method. The remaining pore density decreased rapidly with decrease of the growth rate from about 20 nm/min.

From another standpoint, the present invention provides an epitaxial layer having crystal defect density of less than 1000/cm$^2$ by controlling the thickness of a transition layer between the epitaxial layer and the porous layer. The thickness of the epitaxial silicon layer can readily be made uniform within the range of ±4% by employing epitaxial growth by CVD using a source material diluted by hydrogen.

When pores remains on the porous silicon, the ultrathin oxide film remaining in the inside of the pores vaporizes by etching with hydrogen, which raises the oxygen concentration locally in the vicinity of the surface. The oxygen may recombine onto the surface of the porous silicon. However, the small amount of film-constituting atoms or fed atom gas can effectively eliminate the oxide to prevent the occurrence of defects caused by the oxide.

Further, according to the present invention, nucleus formation by collision of the introduced atoms is prevented, and surface diffusion is predominant, resulting in high coverage, which covers any foreign matter on the surface without formation of a pinhole there.

Furthermore according to the present invention, the surface roughness is reduced in comparison with that of conventional high-rate growth, lamination bonding strength is improved in lamination by ELTRAN, or a like method without causing weak bonding or non-bonding.

An example of application of the semiconductor substrate of the present invention to production of an SOI substrate is described before by reference to FIGS. 7A to 7E. Other embodiments are described below in which the constitution of the laminated member is different therefrom.

Embodiment 2

Figure 8A:
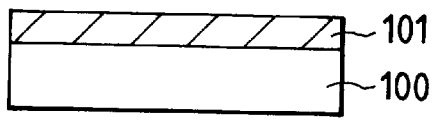
FIGS. 8A to 8G illustrate schematically other examples of the process for producing the semiconductor substrate of the present invention.
Figure 8B:
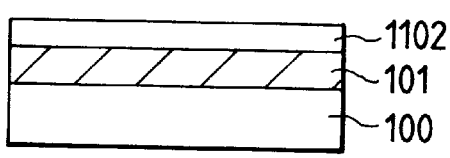
Figure 8E:
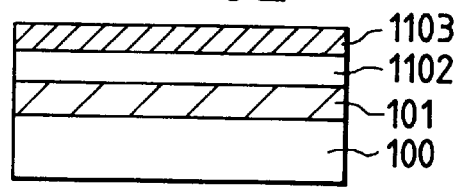
Figure 8C:
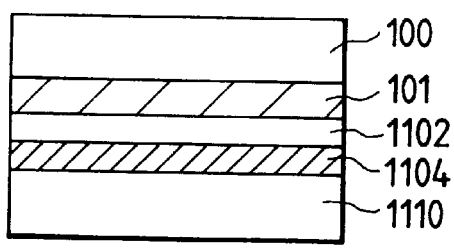
Figure 8F:
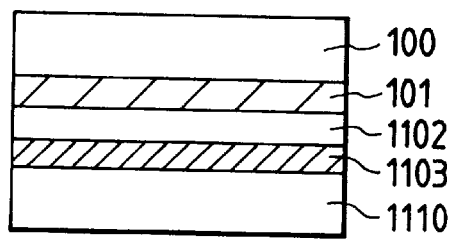
Figure 8D:
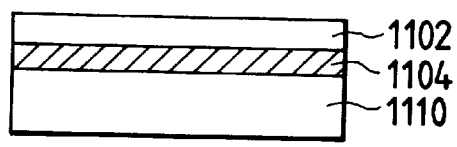
Figure 8G:
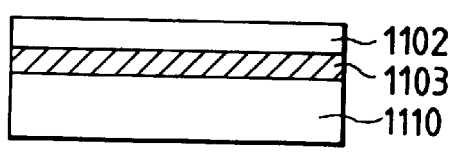

An embodiment of the present invention is explained below by reference to FIGS. 8A to 8G. In FIGS. 8A to 8G, the same reference numbers are used as in FIGS. 7A to 7E for the same members. In the embodiment shown in FIGS. 7A to 7E, the two substrates are laminated by bonding the SiO$_2$ layer 103 of one substrate with the SiO$_2$ layer 104 of another substrate. However, only at least one of the surfaces to be bonded is required to be constituted of SiO$_2$. In one example of this embodiment (shown in FIGS. 8A to 8D), an epitaxial silicon layer 1102 in FIG. 8B formed on a porous silicon layer is bonded with an oxide layer 1104 in FIG. 8C formed on a silicon substrate 1110. In another example of embodiment (shown in FIGS. 8A and 8E to 8G), the surface of an epitaxial silicon layer 1102 in FIG. 8E is thermally oxidized, and the resulting oxide film 1103 is bonded with the surface of a non-oxidized silicon substrate 1110 as shown in FIG. 8F. In this Embodiment, the other steps are conducted in the same manner as in the embodiment shown in FIGS. 7A to 7E.

Embodiment 3

Figure 9A:
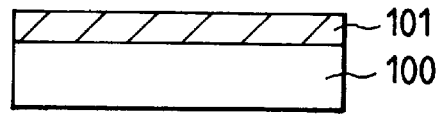
FIGS. 9A to 9G illustrate schematically still other examples of the process for producing the semiconductor substrate of the present invention.
Figure 9B:
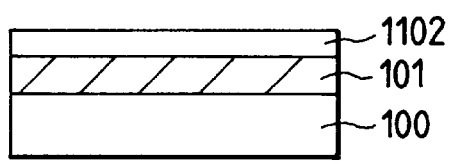
Figure 9E:
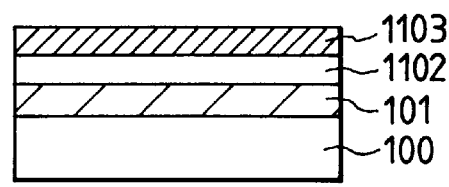
Figure 9C:
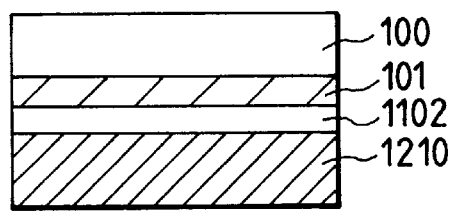
Figure 9F:
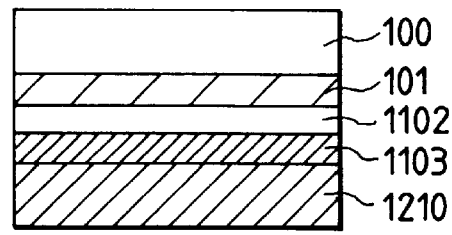
Figure 9D:
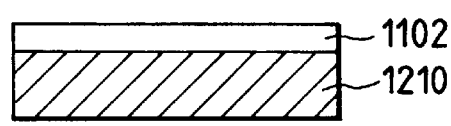
Figure 9G:
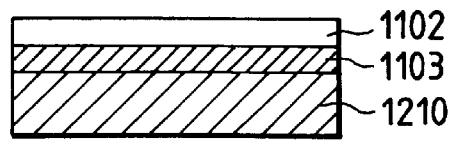

An embodiment of the present invention is explained by reference to FIGS. 9A to 9G. In FIGS. 9A to 9G, the same reference numbers are used as in FIGS. 7A to 7E for the same members. This embodiment is characterized by a glass material 1210 (FIGS. 9C and 9F) such as quartz glass and blue plate glass employed as the second substrate to be laminated onto the first substrate (FIGS. 9B and 9E) having an epitaxial silicon film formed thereon. In one example of this embodiment (shown in FIGS. 9A to 9D), an epitaxial silicon layer 1102 in FIG. 9B is bonded to a glass substrate 1210 in FIG. 9C. In another example of this embodiment (shown in FIGS. 9A and 9E to 9G), an oxide film 1103, which has been formed by thermal oxidation of the surface of an epitaxial silicon layer 1102 in FIG. 9E, is bonded to a glass substrate 1210 as shown in FIG. 9F. In this embodiment, the other steps are conducted in the same manner as in the embodiment shown in FIGS. 7A to 7E.

In the present invention, important is the process for epitaxial growth of a monocrystalline silicon layer on a porous silicon layer.

The porous silicon was discovered by Uhlir in 1964, and was investigated for application to FIPOS in 1970s. Photoluminescence was found in 1990 or later by T. Canham, et al. and U. Gosele, et al., and since then, the porous silicon has been studied for application to light-emitting devices. In studies on the light-emitting device, n$^-$- or p$^-$-silicon substrates are preferred. On the other hand, in production of SOI structures, n$^+$- or p$^+$-substrates are preferred owing to the stability of structure and high crystallinity of the epitaxial silicon layer, rather than n$^-$- or p$^-$-substrates. The porous silicon which is the object of the present invention is the same as the porous silicon which has been studied generally, and prepared by processes such as anodization, not being limited in the impurities, the plane orientation, and the preparation method.

In anodization for formation of porous silicon, the anodization solution is an aqueous solution containing HF as the main active component. Generally, the anodization solution contains additionally ethanol or a like alcohol for increasing the contact angle on the silicon surface to promote separation of bubbles from the silicon surface and to uniformize the anodization. Naturally the porous layer can be formed without the alcohol. The porosity of the porous silicon according to the present invention is preferably about 56% for FIPOS, and lower than that (preferably less than about 50%, more preferably less than 30%) for use for ELTRAN, but is not limited thereto.

The surface of the porous silicon having been formed by etching as above has fine roughness in the portions other than the pores, which is observable by field emission type scanning electron microscopy (FESEM).

As already mentioned, the internal walls of the pores may be subjected to preoxidation in the present invention. The silicon oxide film formed by preoxidation may be removed from the porous layer surface and the vicinity thereof by dipping into a low concentration of aqueous HF solution (HF dipping). This is shown by the schematic sectional view in FIG. 4A. Sato, et al. reported that longer time of HF dipping reduced the lamination defects to the level of about 10$^3$/cm$^2$ (N. Sato, K. Sakaguchi, K. Yamagata, Y. Fujiyama, and T. Yonehara, Proc. of the Seventh Int. Symp. on Silicon Mater. Sci. and Tech., Semiconductor Silicon (Pennington, The Electrochem. Soc. Inc., 1994) p.443). However, the inventors of the present invention found by further experiments that longer time of HF dipping sometimes coarsens the porous layer structure depending on the annealing temperature after lamination to leave unetched portions (etching residues) in etching of the porous silicon. In the present invention, however, the HF dipping is not indispensable since crystal defect density can be reduced by feeding Si atoms in a small amount not to form nuclei onto the porous silicon surface. The omission of HF dipping prevented formation of etching residue completely.

In the present invention, a monocrystalline silicon layer is epitaxially grown on a porous silicon layer formed on a substrate in an epitaxial growth apparatus, for example, the steps below:

(1) Removal of natural oxide film:

The natural oxide film is removed by heat treatment in hydrogen atmosphere (non-oxidative atmosphere), or heat treatment in ultrahigh vacuum at about 800° C. The heat treatment temperature is preferably not lower than 600° C., more preferably not lower than 1000° C. The pressure is preferably not higher than the atmospheric pressure, but is not specially limited.

The natural oxide film is removed into the air by the reaction:

$$SiO_2 + Si \rightarrow 2SiO\uparrow$$

The natural oxide may be removed by use of HF. This heat treatment step for the natural oxide removal may be omitted if the substrate after HF dipping is transferred into a Roadlock chamber under a nitrogen atmosphere and then placed in a growth furnace without exposure to an oxygen-containing atmosphere.

(2) Blocking of Pores:

In continuation of the heat treatment in a hydrogen atmosphere after the aforementioned natural oxide removal step (1), the atoms on the surface of the porous silicon migrate to flatten fine roughness of the surface and to lower the surface energy, and most of the pores disappear from the surface. However, not all the pores are blocked on the surface of the porous silicon, since Si atoms are deficient for the unit surface area depending on the porosity. FIG. 4B shows this state schematically. Further, in high-temperature treatment above 1000° C. in a hydrogen atmosphere, silicon is etched by hydrogen, which increases the deficiency of silicon atoms. Although the subsequent step may conducted with the pores incompletely blocked, sufficiently long time of the above heat treatment in hydrogen atmosphere is more preferable for decreasing the pore density on the porous silicon surface and for uncovering the step structure to decrease the adsorption site density on the surface. Si(100) has steps and terraces of (2×1) structure.

This process need not necessarily be conducted in a reductive atmosphere like hydrogen or nitrogen, but may be conducted in an inert gas such as argon and helium, provided that the oxidative atmosphere such as residual moisture and oxygen is sufficiently removed.

The removal of the natural oxygen film and the blocking of the pores not always proceed successively, but can proceed simultaneously or proceed with in-plane distribution on the substrate surface. Therefore, the process of oxygen film removal and the pore blocking are not always distinguished clearly.

(3) Feed of small amount of source material:

Atoms or the source gas are fed by diluting with $H_2$ onto the surface of the porous silicon in such a small feeding rate that the fed atoms do not form nuclei. The fed atoms or the source gas diffuse on the surface of the porous layer, and are incorporated into adsorption site such as steps at the remaining pore portion to block the remaining pores. FIG. 4C illustrates this state schematically.

Specifically, pore diameter distribution is measured with porous silicon formed preliminarily under the same conditions, and therefrom the largest pore diameter is derived. The feed rate of the atoms or the source gas is reduced to lower the growth rate so that the remaining pore density may become less than $1000/cm^2$ at the time when the layer has grown in a thickness equal to the largest pore diameter. The largest pore diameter may be derived by direct measurement of pore diameter distribution by gas adsorption or a like method, or as the sum of the average pore diameter and three times the standard deviation obtained by the pore diameter distribution measurement.

In the CVD growth employing a silicon source gas such as $SiH_2Cl_2$ (dichlorosilane), $SiH_4$ (silane), $SiHCl_3$ (trichlorosilane), $SiCl_4$ (tetrachlorosilane), and $Si_2H_6$ (disilane), the source gas is fed at a flow rate to give growth rate of preferably not more than 20 nm/min, more preferably not more than 10 nm/min, still more preferably not more than 2 nm/min. The temperature of the substrate is preferably higher to raise the surface mobility of the atoms introduced onto the surface, preferably not lower than 800° C., more preferably not lower than 900° C., still more preferably not lower than 1000° C., but is not limited thereto, provided that the surface mobility is sufficient for the atom feed rate. The upper limit of the substrate temperature depends on the degree of the coarseness of the porous silicon structure. The promoted surface diffusion of the atoms on the growth surface reduces the surface roughness.

The fed source material is not limited to silicon or silicon type gas, but may be a heteroepitaxy material of Group IV such as SiGe, and SiC, or a compound semiconductor such as GaAs.

(4) Growth:

After completion of the blocking of the pores by the small amount feeding of the source material, the rate of the succeeding growth is not specially limited, and may be the same as usual growth on bulk silicon. The succeeding growth may allowed to proceed continuously at the same rate as the small amount gas feeding growth, or with different kind of gas. These possibilities are not against the requirement of the present invention. The growth may be interrupted at the time of completion of the small-amount-gas feeding growth, and the required source material may be newly fed, although the processes are not separated. In any way, the monocrystalline layer is grown to a desired layer thickness. FIG. 4D shows schematically a sectional view of this state.

The growth temperature of this process can be controlled independently of the above process (3). Lowering of the treatment temperature in this process prevents coarsening of the porous silicon structure, and autodoping or solid diffusion of impurity such as boron and phosphorus from the porous silicon.

The material of the grown monocrystalline layer is not limited to silicon or silicon type gas, but may be a heteroepitaxy material of Group IV such as SiGe, and SiC, or a compound semiconductor such as GaAs, and may be different from the material for the small amount material feeding process.

The process of the present invention is applicable to formation of SOI structure through partial removal of epitaxial growth layer by FIPOS and selective oxidation of porous silicon, and is also applicable to heteroepitaxial growth, on an epitaxial silicon layer formed on porous silicon layer, of a compound semiconductor such as GaAs, or Group IV type such as SiC, and SiGe.

The present invention is described below in more detail by reference to Examples.

Example 1

This Example shows reduction of crystal defects in an epitaxial silicon layer formed on a porous silicon according to the present invention.

(1) Five 5-inch silicon(100) wafers were prepared which contained boron as a p-type impurity, and had a resistivity of 0.01 to 0.02 Ωcm.

(2) In a mixed solution composed of 49% HF and ethyl alcohol (mixing ratio 2:1), the above silicon wafer was placed as the anode, and a platinum plate of 5 inch diameter was placed as the cathode in opposition to the silicon wafer. The back face of the silicon wafer was coated to prevent conduction to the platinum plate through the solution. The side edge of the silicon wafer was also coated, whereas the entire of the front face of the silicon wafer was bared to conduct to the platinum plate through the solution. The silicon wafer was anodized by applying electric current between the silicon wafer and the platinum plate at a current density of 10 mA/cm$^2$ for 12 minutes to form a porous silicon surface layer of 12 μm thick. This anodization was practiced for respective wafers separately. One of the wafers having a porous layer was subjected to porosity measurement, and was found to have a porosity of about 20%.

(3) The five wafers having a porous silicon wafer were treated for oxidation at 400° C. in an oxygen atmosphere for one hour. The oxidation under such conditions gave oxide films of as thin as not more than 50 Å. Therefore, the silicon oxide film is formed only on the surface and pore walls of the porous silicon, leaving monocrystalline silicon unoxidized in the interior as shown in Japanese Patent Laid-Open Application No. 5-217827.

(4) The five wafers were immersed in an aqueous diluted 1.25% HF solution for about 30 minutes, and washed with water to remove the ultrathin silicon oxide film from the surface of the porous layer.

(5) The wafer was heat-treated successively under the conditions below in a CVD growth furnace. The growth was conducted with the conditions (b) varied for respective wafers.

| (a) Temperature: 1150° C. | |
|---|---|
| Pressure: | 760 Torr |
| Gas: | H$_2$, 230 (L/min) |
| Time: | 7.5 min |
| (b) Temperature: 1150° C. | |
| Pressure: | 760 Torr |
| Gas: | H$_2$, 230 (L/min) |
|  | SiH$_2$Cl$_2$, variable (L/min) |
| Time: | 5 min |
| The flow rate of SiH$_2$Cl$_2$ for the respective wafers was 0.005, 0.01, 0.05, 0.1, or 0.25 (L/min). The growth rate was 2.8, 5.6, 28, 56, or 140 nm/min, correspondingly. | |

By adjusting the growth time, monocrystalline silicon layers were formed in thickness of about 1 μm.

(6) The crystal defects were developed by Secco etching, and the density of the crystal defects in the monocrystalline silicon layer was measured by a Nomarskii differential interference microscope. As the results, most of the crystal defects were lamination defects, and the density was, depending on the SiH$_2$Cl$_2$ flow rate in the heat treatment (b), respectively, $2 \times 10^2$/cm$^2$ at 0.005 L/min, $3.5 \times 10^2$/cm$^2$ at 0.01 L/min, $1.1 \times 10^3$/cm$^2$ at 0.05 L/min, $1.3 \times 10^3$/cm$^2$ at 0.1 L/min, and $1.2 \times 10^3$/cm$^2$ at 0.5 L/min. Thus the introduction of the step (b) and the lowering of the gas flow rate in the step (b) from 0.05 to 0.01 L/min or lower remarkably decreased the lamination defect density by a factor of about ⅓ to ⅕.

The mean square roughness was measured by scanning a region of 50 μm square by interatomic force microscopy. The mean square roughness was 0.21, 0.22, 0.51, 0.52, or 0.51 nm respectively, corresponding to the growth rate of 2.8, 5.6, 28, 56, or 140 nm/min. The lowering of the gas flow rate below 28 nm/min decreased the surface roughness similarly as the crystal defect density. A commercial Si wafer had a surface roughness of 0.23 nm as measured in the same manner. Therefore the grown monocrystalline silicon layer had a flat surface comparable to an Si wafer.

Example 2

This Example shows reduction of crystal defects in an epitaxial silicon layer formed on a porous silicon without decreasing the growth rate.

(1) Five 5-inch silicon(100) wafers were prepared which contained boron as a p-type impurity, and had a resistivity of 0.01 to 0.02 Ωcm.

(2) In a mixed solution composed of 49% HF and ethyl alcohol (mixing ratio 2:1), the above silicon wafer was placed as the anode, and a platinum plate of 5 inch diameter was placed as the cathode in opposition to the silicon wafer. The back face of the silicon wafer was coated to prevent conduction to the platinum plate through the solution. The side edge of the silicon wafer was also coated, whereas the entire of the front face of the silicon wafer was bared to conduct to the platinum plate through the solution. The silicon wafer was anodized by applying electric current between the silicon wafer and the platinum plate at a current density of 10 mA/cm$^2$ for 12 minutes to form a porous silicon surface layer of 12 μm thick. This anodization was practiced for respective wafers separately. One of the wafers having a porous layer was subjected to porosity measurement, and was found to have a porosity of about 20%.

(3) The five wafers having a porous silicon wafer were treated for oxidation at 400° C. in an oxygen atmosphere for one hour. The oxidation under such conditions gave oxide films 50 Å less thick. Therefore, the silicon oxide film is formed only on the surface and pore walls of the porous silicon, leaving monocrystalline silicon unoxidized in the interior.

(4) The five wafers were immersed in an aqueous diluted 1.25% HF solution for about 30 minutes, and washed with water to remove the ultrathin silicon oxide film formed on the porous layer.

(5) The wafer was heat-treated successively under the conditions below in a CVD growth furnace. The growth was conducted with the conditions (b) varied for respective wafers.

| (a) Temperature: 1150° C. | |
|---|---|
| Pressure: | 760 Torr |
| Gas: | H$_2$, 230 (L/min) |
| Time: | 7.5 min |
| (b) Temperature: 1150° C. | |
| Pressure: | 760 Torr |
| Gas: | H$_2$, 230 (L/min) |
|  | SiH$_2$Cl$_2$, variable (L/min) |
| Time: | 5 min |
| The flow rate of SiH$_2$Cl$_2$ for the respective wafers was 0.005, 0.01, 0.05, 0.1, or 0.25 (L/min). The growth rate was 2.8, 5.6, 28, 56, or 140 nm/min, correspondingly. | |

-continued

| (c) Temperature: 1150° C. | |
|---|---|
| Pressure: | 760 Torr |
| Gas: | $H_2/SiH_2Cl_2$ 230/0.25 (L/min) |
| Time: | 13 min |

By the above heat treatments, monocrystalline silicon layers were formed in thickness of about 2 μm.

(6) The crystal defects were developed by Secco etching, and the density of the crystal defects in the monocrystalline silicon layer was measured by a Nomarskii differential interference microscope. As the results, most of the crystal defects were lamination defects, and the density was, depending on the $SiH_2Cl_2$ flow rate in the heat treatment (b), respectively, $2.1 \times 10^2/cm^2$ at 0.005 L/min, $3.4 \times 10^2/cm^2$ at 0.01 L/min, $1.1 \times 10^3/cm^2$ at 0.05 L/min, $1.2 \times 10^3/cm^2$ at 0.1 L/min, and $1.2 \times 10^3/cm^2$ at 0.5 L/min. Thus the introduction of the step (b) and the lowering of the gas flow rate in the step (b) from 0.05 to 0.01 L/min or lower decreased remarkably the lamination defect density by a factor of about ⅓ to ⅕. Since the lamination defect density was comparable to that in Example 1, the step (c) is considered not to affect the defect formation. Therefore, the combination of the slow growth process (b) with the rapid growth step (c) shortened the growth time by a factor of about ½ to about 1/50 from the growth rate ratio without increasing the crystal defects.

Example 3

(1) Five 5-inch silicon (100) wafers were prepared which contained boron as a p-type impurity, and had a resistivity of 0.01 to 0.02 Ωcm.

(2) In a mixed solution composed of 49% HF and ethyl alcohol (mixing ratio 2:1), the above silicon wafer was placed as the anode, and a platinum plate of 5 inch diameter was placed as the cathode in opposition to the silicon wafer. The reverse face of the silicon wafer was coated to prevent conduction to the platinum plate through the solution. The side edge of the silicon wafer was also coated, whereas the entire of the front face of the silicon wafer was bared to conduct to the platinum plate through the solution. The silicon wafer was anodized by applying electric current between the silicon wafer and the platinum plate at a current density of 10 mA/cm² for 12 minutes to form a porous silicon surface layer of 12 μm thick. This anodization was practiced for respective wafers separately. One of the wafers having a porous layer was subjected to porosity measurement, and was found to have a porosity of about 20%.

(3) The wafer was placed in a CVD growth furnace, and heat-treated successively under the conditions below. The growth was conducted with the conditions (b) varied for respective wafers.

| (a) Temperature: 900° C. | |
|---|---|
| Pressure: | 20 Torr |
| Gas: | $H_2$, 230 (L/min) |
| Time: | 7.5 min |

| (b) Temperature: 900° C. | |
|---|---|
| Pressure: | 20 Torr |
| Gas: | $H_2$, 230 (L/min) |
| | $SiH_4$, variable (L/min) |
| Time: | 5 min |
| | The flow rate of $SiH_4$ for the respective five wafers was 0.005, 0.01, 0.05, 0.1, or 0.5 (L/min). The growth rate was 2.8, 5.6, 28, 56, or 140 nm/min, correspondingly. |

| (c) Temperature: 900° C. | |
|---|---|
| Pressure: | 20 Torr |
| Gas: | $H_2/SiH_4$ 230/0.25 (L/min) |
| Time: | 13 min |

By the above heat treatments, monocrystalline silicon layers were formed in thickness of about 2 μm.

(4) The crystal defects were developed by Secco etching, and the density of the crystal defects in the monocrystalline silicon layer was measured by a Nomarskii differential interference microscope. As the results, most of the crystal defects were lamination defects, and the density was, depending on the $SiH_4$ flow rate in the heat treatment (b), respectively, $2.1 \times 10^2/cm^2$ at 0.005 L/min, $3.4 \times 10^2/cm^2$ at 0.01 L/min, $1.1 \times 10^3/cm^2$ at 0.05 L/min, $1.2 \times 10^3/cm^2$ at 0.1 L/min, and $1.2 \times 10^3/cm^2$ at 0.5 L/min. Thus the introduction of the step (b) and the lowering of the $SiH_4$ gas flow rate in the step (b) from 0.05 to 0.01 L/min or lower remarkably decreased the lamination defect density by a factor of about ⅓ to ⅕.

Example 4

(1) Five 5-inch silicon (100) wafers were prepared which contained boron as a p-type impurity, and had a resistivity of 0.01 to 0.02 Ωcm.

(2) In a mixed solution composed of 49% HF and ethyl alcohol (mixing ratio 2:1), the above silicon wafer was placed as the anode, and a platinum plate of 5 inch diameter was placed as the cathode in opposition to the silicon wafer. The reverse face of the silicon wafer was coated to prevent conduction to the platinum plate through the solution. The side edge of the silicon wafer was also coated, whereas the entire of the front face of the silicon wafer was bared to conduct to the platinum plate through the solution. The silicon wafer was anodized by applying electric current between the silicon wafer and the platinum plate at a current density of 10 mA/cm² for 12 minutes to form a porous silicon surface layer 12 μm thick. This anodization was practiced for respective wafers separately. One of the wafers having a porous layer was subjected to porosity measurement, and was found to have a porosity of about 20%.

(3) The five wafers having a porous silicon wafer were treated for oxidation at 400° C. in an oxygen atmosphere for one hour. The oxidation under such conditions gave oxide films 50 Å less thick. Therefore, the silicon oxide film is formed only on the surface and pore walls of the porous silicon, leaving monocrystalline silicon unoxidized in the interior.

(4) The five wafers were immersed in an aqueous diluted 1.25% HF solution for about 30 minutes, and washed with water to remove the ultrathin silicon oxide film formed on the porous layer.

(5) The wafer was placed in a CVD growth furnace, and heat-treated successively under the conditions below. The growth was conducted with the conditions (b) varied for respective wafers.

| (a) Temperature: 1100° C. | |
|---|---|
| Pressure: | 80 Torr |
| Gas: | $H_2$, 230 (L/min) |
| Time: | 7.5 min |
| (b) Temperature: 1100° C. | |
| Pressure: | 80 Torr |
| Gas: | $H_2$, 230 (L/min) |
| | $SiH_4$, variable (L/min) |
| Time: | 5 min |
| The growth rate was controlled to 2, 5, 10, 50, or 140 nm/min for the respective wafers by adjusting the flow rate of $SiH_4$. | |
| (c) Temperature: 900° C. | |
| Pressure: | 80 Torr |
| Gas: | $H_2/SiH_2Cl_2$ 230/0.25 (L/min) |

By the above heat treatments, monocrystalline silicon layers were formed in thickness of about 2 μm.

(6) The crystal defects were developed by Secco etching, and the density of the crystal defects in the monocrystalline silicon layer was measured by a Nomarskii differential interference microscope. As the results, most of the crystal defects were lamination defects, and the density was, depending on the growth rate in the heat treatment (b), respectively, $1 \times 10^2/cm^2$ at 2 nm/min, $3 \times 10^2/cm^2$ at 5 nm/min, $5 \times 10^2/cm^2$ at 10 nm/min, $1.7 \times 10^3 cm^2$ at 50 nm/min, and $1.6 \times 10^3/cm^2$ at 140 nm/min. Thus the introduction of the treatment (b) and the lowering of the growth rate in the treatment (b) from 50 to 10 nm/min or lower decreased remarkably the lamination defect density by a factor of about 1/3 to 1/15. The cross-sectional face of the substrates obtained in this example and Example 2 were observed by high resolution scanning microscopy, and the porous layer structure was found to be coarsened less.

The substrate of this invention, and the one of Example 2 grown respectively at a rate of 5 nm/min, and 5.6 nm/nm in the heat treatment (b) were subjected to SIMS (secondary ion mass spectrometry) analysis to measure concentration distribution of boron in the depth direction. In the substrate of Example 2, the epitaxial silicon layer contained boron at a concentration of $10^{18}/cm^3$ or higher throughout the layer, whereas in the substrate of this example, boron was found to have diffused into the epitaxial silicon layer only about 100 nm from the interface with the porous silicon, and the surface side therefrom contained boron at a concentration of about $10^{15}/cm^3$. Thus, decrease of the crystal defect density and prevention of the diffusion of boron from the porous layer were simultaneously realized.

Example 5

(1) Two 5-inch silicon (100) wafers were prepared which contained boron as a p-type impurity, and had a resistivity of 0.01 to 0.02 Ωcm.

(2) In a mixed solution composed of 49% HF and ethyl alcohol (mixing ratio 2:1), the above silicon wafer was placed as the anode, and a platinum plate of 5 inch diameter was placed as the cathode in opposition to the silicon wafer. The reverse face of the silicon wafer was coated to prevent conduction to the platinum plate through the solution. The side edge of the silicon wafer was also coated, whereas the entire of the front face of the silicon wafer was bared to conduct to the platinum plate through the solution. The silicon wafer was anodized by applying electric current between the silicon wafer and the platinum plate at a current density of 10 mA/cm² for 12 minutes to form a porous silicon surface layer of 12 μm thick. This anodization was practiced for respective wafers separately. One of the wafers having a porous layer was subjected to porosity measurement, and was found to have a porosity of about 20%.

(3) The two wafers having a porous silicon wafer were treated for oxidation at 400° C. in an oxygen atmosphere for one hour. The oxidation under such conditions formed oxide films of as thin as not more than 50 Å. Therefore, the silicon oxide film is formed only on the surface and pore walls of the porous silicon, leaving monocrystalline silicon unoxidized in the interior.

(4) The five wafers were immersed in an aqueous diluted 1.25% HF solution for about 30 minutes, and washed with water to remove the ultrathin silicon oxide film formed on the porous layer.

(5) The wafer was placed in a CVD growth furnace, and heat-treated successively under the conditions below.

| (a) Temperature: 1120° C. | |
|---|---|
| Pressure: | 80 Torr |
| Gas: | $H_2$, 230 (L/min) |
| Time: | 7.5 min |
| (b) Temperature: 1120° C. | |
| Pressure: | 80 Torr |
| Gas: | $H_2$, 230 (L/min) |
| | $SiH_2Cl_2$, 0.005 (L/min) |
| Time: | 5 min |
| (c) Temperature: 900° C. | |
| Pressure: | 80 Torr |
| Gas: | $H_2/SiH_2Cl_2$ 230/0.4 (L/min) |

By the above heat treatments, monocrystalline silicon layers were formed in a thickness of about 0.25 μm. The thickness the formed monocrystalline silicon layer was measured at 100 lattice points at intervals of 1 cm over the entire of the wafer surface by a spectroreflectance method. The layer thickness distribution was 252 nm±8.1 nm (3.2%).

In the crystal growth on one of the two wafers, the heat treatment (b) was omitted.

(6) The respective wafers were treated for oxidation in an atmosphere of a mixture of oxygen and hydrogen at 900° C. to form a silicon oxide film of 50 nm thick.

(7) The above wafer and a second wafer having an oxide film formed thereon were cleaned chemically as in usual semiconductor process, and the surfaces of the wafers were brought into contact together slowly. Thereby the two wafers came to be bonded and integrated. Then the bonded wafers were heat-treated at 800° C. for 2 hours. The resulting two pairs of bonded wafers were observed by infrared camera. As the results of the observation, the wafer pair having been prepared without the treatment (b) had several defective bonding spots in the peripheral portion of the wafer, whereas the one having been prepared with the treatment (b) had no defective bonding.

(8) The reverse face of the wafer having porous silicon layer of the wafer was polished to bare the entire porous silicon on the entire face of the substrate. The wafer was immersed in an aqueous mixed solution containing HF, $H_2O_2$ and alcohol for about 2 hours to remove the porous silicon by etching, thereby, the epitaxial silicon layer came to be transferred onto the second wafer with interposition of silicon oxide.

(9) This substrate was heat-treated at 1000° C. in a 100% hydrogen atmosphere for 6 hours.

(10) The entire surface of the epitaxial silicon layer was observed carefully with a Nomarskii differential interference microscope. The substrate having been prepared without the treatment (b) of the step (5) had about 100 pinholes on the surface, and voids which are considered to be formed by etching of the silicon oxide film by the etching solution having penetrated through the pinholes into the interface of bonding. The substrate having been prepared with the treatment (b) was observed to have only two voids.

The layer thickness was measured to be 229.5 nm±8.0 nm (3.5%) over the entire face of the substrate. An ohmic contacting electrode was attached respectively to the surface Si layer of this substrate and the supporting substrate, and the current-voltage characteristics were evaluated between the two electrodes. No current flowed, and thereby the insulation between the electrodes by the interposed oxide film was confirmed. In other words, no pinhole was formed in the interposed oxide film.

Example 6

(1) Five 5-inch silicon (100) wafers were prepared which contained boron as a p-type impurity, and had a resistivity of 0.01 to 0.02 Ωcm.

(2) In a mixed solution composed of 49% HF and ethyl alcohol (mixing ratio 2:1), the above silicon wafer was placed as the anode, and a platinum plate of 5 inch diameter was placed as the cathode in opposition to the silicon wafer. The reverse face of the silicon wafer was coated to prevent conduction to the platinum plate through the solution. The side edge of the silicon wafer was also coated, whereas the entire of the front face of the silicon wafer was bared to conduct to the platinum plate through the solution. The silicon wafer was anodized by applying electric current between the silicon wafer and the platinum plate at a current density of 10 mA/$cm^2$ for 12 minutes to form a porous silicon surface layer of 12 μm thick. This anodization was practiced for respective wafers separately. One of the wafers having a porous layer was subjected to porosity measurement, and was found to have a porosity of about 20%.

(3) The five wafers having a porous silicon wafer were treated for oxidation at 400° C. in an oxygen atmosphere for one hour. The oxidation under such conditions formed oxide films 50 Å or less thick. Therefore, the silicon oxide film is formed only on the surface and pore walls of the porous silicon, leaving monocrystalline silicon unoxidized in the interior.

(4) The five wafers were immersed in an aqueous diluted 1.25% HF solution for about 30 minutes, and washed with water to remove the ultrathin silicon oxide film formed on the porous layer.

(5) The wafer was placed in a CVD growth furnace, and heat-treated successively under the conditions below. The growth condition (b) was varied for respective wafers.

| (a) Temperature: 1100° C. | |
|---|---|
| Pressure: | 80 Torr |
| Gas: | $H_2$, 230 (L/min) |
| Time: | 7.5 min |

| -continued | |
|---|---|
| (b) Temperature: 1100° C. | |
| Pressure: | 80 Torr |
| Gas: | $H_2$, 230 (L/min) |
| | $SiH_4$, variable (L/min) |
| Time: | 5 min |
| The growth rate was controlled to 2, 5, 10, 50, or 140 nm/min for the respective wafers by adjusting the flow rate of $SiH_4$. | |
| (c) Temperature: 900° C. | |
| Pressure: | 80 Torr |
| Gas: | $H_2/SiH_2Cl_2$ 230/0.25 (L/min) |

By the above heat treatments, monocrystalline silicon layers were formed in thickness of about 2 μm.

(6) On the surface of the wafer, an oxide film was formed. The wafer and a quartz glass substrate were cleaned chemically as in usual semiconductor process. The surfaces of the wafer and the quartz glass substrate were exposed to oxygen plasma, and washed with water. The surfaces were brought into contact together slowly. Thereby the two came to be bonded and integrated. Then the bonded wafers were heat-treated at 300° C. for 2 hours.

(7) The reverse face of the wafer having porous silicon layer of the wafer was polished to bare the entire porous silicon on the entire face of the substrate. The wafer was immersed in an aqueous mixed solution containing HF, $H_2O_2$, and alcohol for about 2 hours to remove the porous silicon by etching, thereby, the epitaxial silicon layer came to be transferred onto the second wafer with interposition of silicon oxide.

(8) The crystal defects were developed by Secco etching, and the density of the crystal defects in the monocrystalline silicon layer was measured by a Nomarskii differential interference microscope. As the results, most of the crystal defects were lamination defects, and the density was, depending on the growth rate in the heat treatment (b), respectively, $1 \times 10^2/cm^2$ at 2 nm/min, $3 \times 10^2/cm^2$ at 5 nm/min, $5 \times 10^2/cm^2$ at 10 nm/min, $1.7 \times 10^3/cm^2$ at 50 nm/min, and $1.6 \times 10^3/cm^2$ at 140 nm/min. Thus the introduction of the treatment (b) and the lowering of the growth rate in the treatment (b) from 50 to 10 nm/min or lower remarkably decreased the lamination defect density by a factor of about ⅓ to ⅟₁₅.

Example 7

(1) Five 5-inch silicon (100) wafers were prepared which contained boron as a p-type impurity, and had a resistivity of 0.01 to 0.02 Ωcm.

(2) In a mixed solution composed of 49% HF and ethyl alcohol (mixing ratio 2:1), the above silicon wafer was placed as the anode, and a platinum plate of 5 inch diameter was placed as the cathode in opposition to the silicon wafer. The reverse face of the silicon wafer was coated to prevent conduction to the platinum plate through the solution. The side edge of the silicon wafer was also coated, whereas the entire of the front face of the silicon wafer was bared to conduct to the platinum plate through the solution. The silicon wafer was anodized by applying electric current between the silicon wafer and the platinum plate at a current density of 10 mA/$cm^2$ for 12 minutes to form a porous silicon surface layer of 12 μm thick. This anodization was practiced for respective wafers separately. One of the wafers having a porous layer was subjected to porosity measurement, and was found to have a porosity of about 20%.

(3) The wafer was placed in a CVD growth furnace, and heat-treated successively under the conditions below for the growth. The growth conditions (b) were varied for respective wafers.

(a) Temperature: 900° C.

| Pressure: | 20 Torr |
|---|---|
| Gas: | $H_2$, 230 (L/min) |
| Time: | 7.5 min |

(b) Temperature: variable

| Pressure: | 20 Torr |
|---|---|
| Gas: | $H_2$, 230 (L/min) |
|  | $SiH_4$, 0.005 (L/min) |
| Time: | 5 min |

The temperature for the respective five wafers was 700° C., 750° C., 770° C., 800° C., and 900° C. The growth rate was 2.8, 5.6, 28, 56, or 140 nm/min, correspondingly.

(c) Temperature: 900° C.

| Pressure: | 29 Torr |
|---|---|
| Gas: | $H_2/SiH_4$ 230/0.25 (L/min) |
| Time: | 13 min |

By the above heat treatments, monocrystalline silicon layers were formed in thickness of about 2 μm.

(4) The crystal defects were developed by Secco etching, and the density of the crystal defects in the monocrystalline silicon layer was measured by a Nomarskii differential interference microscope. As the results, most of the crystal defects were lamination defects, and the density was, depending on the temperature in the heat treatment (b), respectively, $2.1 \times 10^2/cm^2$ at 900° C., $3.4 \times 10^2/cm^2$ at 800° C., $1.2 \times 10^5/cm^2$ at 770° C., $5 \times 10^5 cm^2$ at 750° C., and $1.2 \times 10^6 cm^2$ at 700° C. L/min. Thus the introduction of the heat-treatment (b) and the raise of the temperature in the heat treatment (b) from 770° C. to 800° C. remarkably decreased the lamination defect density by a factor of about 1/3 to 1/1000.

Example 8

(1) Five 5-inch silicon (100) wafers were prepared which contained boron as a p-type impurity, and had a resistivity of 0.01 to 0.02 Ωcm.

(2) In a mixed solution composed of 49% HF and ethyl alcohol (mixing ratio 2:1), the above silicon wafer was placed as the anode, and a platinum plate of 5 inch diameter was placed as the cathode in opposition to the silicon wafer. The reverse face of the silicon wafer was coated to prevent conduction to the platinum plate through the solution. The side edge of the silicon wafer was also coated, whereas the entire of the front face of the silicon wafer was bared to conduct to the platinum plate through the solution. The silicon wafer was anodized by applying electric current between the silicon wafer and the platinum plate at a current density of 7 mA/cm² for 12 minutes to form a porous silicon surface layer of 12 μm thick. This anodization was practiced for respective wafers separately. One of the wafers having a porous layer was subjected to porosity measurement, and was found to have a porosity of about 16%.

(3) The wafer was placed in a CVD growth furnace, and heat-treated successively under the conditions below. The growth conditions (a) was varied for respective wafers.

(a) Temperature: 900° C.

| Pressure: | 20 Torr |
|---|---|
| Gas: | $H_2$, 230 (L/min) |
|  | $SiH_4$, variable (L/min) |
| Time: | 5 min |

The flow rate of $SiH_4$ was set for each of the five wafers to be 0.005, 0.01, 0.05, 0.1, or 0.5 L/min, respectively. The growth rate was 2.8, 5.6, 28, 56, or 140 nm/min correspondingly.

(b) Temperature: 900° C.

| Pressure: | 20 Torr |
|---|---|
| Gas: | $H_2/SiH_4$, 230/0.25 (L/min) |
| Time: | 13 minutes |

By the above heat treatments, monocrystalline silicon layers were formed in thickness of about 2 μm.

(4) The crystal defects were developed by Secco etching, and the density of the crystal defects in the monocrystalline silicon layer was measured by a Nomarskii differential interference microscope. As the results, most of the crystal defects were lamination defects, and the density was, depending on the flow rate of $SiH_4$ in the heat treatment (a), respectively, $4 \times 10^2/cm^2$ at 0.005 L/min, $5 \times 10^2/cm^2$ at 0.01 L/min, $1.5 \times 10^3/cm^2$ at 0.05 L/min, $1.7 \times 10^3/cm^2$ at 0.1 L/min, and $1.7 \times 10^3/cm^2$ at 0.5 L/min. Thus the introduction of the treatment (a) and the lowering of the flow rate of $SiH_4$ in the treatment (a) from 0.05 to 0.01 L/min or lower remarkably decreased the lamination defect density by a factor of about 1/3 to 1/5.

Example 9

(1) Three 5-inch silicon (100) wafers were prepared which contained boron as a p-type impurity, and had a resistivity of 0.01 to 0.02 Ωcm.

(2) In a mixed solution composed of 49% HF and ethyl alcohol (mixing ratio 2:1), the above silicon wafer was placed as the anode, and a platinum plate of 5 inch diameter was placed as the cathode in opposition to the silicon wafer. The reverse face of the silicon wafer was coated to prevent conduction to the platinum plate through the solution. The side edge of the silicon wafer was also coated, whereas the entire of the front face of the silicon wafer was bared to conduct to the platinum plate through the solution. The silicon wafer was anodized by applying electric current between the silicon wafer and the platinum plate at a current density of 10 mA/cm² for 12 minutes to form a porous silicon surface layer of 12 μm thick. This anodization was practiced for respective wafers separately. One of the wafers having a porous layer was subjected to porosity measurement, and was found to have a porosity of about 20%.

(3) The two wafers having the porous silicon wafer were treated for oxidation at 400° C. in an oxygen atmosphere for one hour. The oxidation under such conditions formed oxide films 50 Å or less thick. Therefore, the silicon oxide film is formed only on the surface and pore walls of the porous silicon, leaving monocrystalline silicon unoxidized in the interior.

(4) The five wafers were immersed in an aqueous diluted 1.25% HF solution for about 30 minutes, and washed with water to remove the ultrathin silicon oxide film formed on the porous layer.

(5) The wafer was placed in a CVD growth furnace, and heat-treated successively under the conditions.

| | (a) Temperature: 1120° C. |
|---|---|
| Pressure: | 80 Torr |
| Gas: | $H_2$, 230 (L/min) |
| Time: | 7.5 min |
| | (b) Temperature: 1120° C. |
| Pressure: | 80 Torr |
| Gas: | $H_2$, 230 (L/min) |
| | $SiH_2Cl_2$, 0.005 (L/min) |
| Time: | 5 min |
| | (c) Temperature: 900° C. |
| Pressure: | 80 Torr |
| Gas: | $H_2/SiH_2Cl_2$ 230/0.4 (L/min) |

By the above heat treatments, monocrystalline silicon layers were formed in a thickness of about 0.29 μm.

In the crystal growth on one of the two wafers, the heat treatment (b) was omitted.

(6) The respective wafers were treated for oxidation in an atmosphere of a mixture of oxygen and hydrogen at 900° C. to form a silicon oxide film of 200 nm thick.

(7) The above wafer and a second wafer were cleaned chemically as in usual semiconductor process, cleaned finally by dipping into a diluted HF solution, and rinsed with pure water, and dried. The surfaces of the wafers were brought into contact together slowly. Thereby the two wafers came to be bonded and integrated. Then the bonded wafers were heat-treated at 1180° C. for 5 minutes.

(8) The reverse face of the wafer having porous silicon layer of the wafer was polished to bare the entire porous silicon on the entire face of the substrate. The wafer was immersed in an aqueous mixed solution containing HF, $H_2O_2$, and alcohol for about 2 hours to remove the porous silicon by etching, thereby, the about 0.2 μm thick epitaxial silicon layer came to be transferred onto the second wafer with interposition of a silicon oxide film.

(9) This substrate was heat-treated at 1100° C. in a 100% hydrogen atmosphere for 4 hours.

(10) The entire surface of the epitaxial silicon layer was observed carefully with a Nomarskii differential interference microscope. The substrate having been prepared without the treatment (b) of the step (5) had about 100 pinholes on the surface, and voids which are considered to be formed by etching of the silicon oxide film by the etching solution having penetrated into the interface of bonding. The substrate having been prepared with the treatment (b) was observed to have only two voids.

Example 10

(1) Three 5-inch silicon (100) wafers were prepared which contained boron as a p-type impurity, and had a resistivity of 0.01 to 0.02 Ωcm.

(2) In a mixed solution composed of 49% HF and ethyl alcohol (mixing ratio 2:1), the above silicon wafer was placed as the anode, and a platinum plate of 5 inch diameter was placed as the cathode in opposition to the silicon wafer. The reverse face of the silicon wafer was coated to prevent conduction to the platinum plate through the solution. The side edge of the silicon wafer was also coated, whereas the entire of the front face of the silicon wafer was bared to conduct to the platinum plate through the solution. The silicon wafer was anodized by applying electric current between the silicon wafer and the platinum plate at a current density of 7 mA/cm² for 12 minutes to form a porous silicon surface layer of 12 μm thick. This anodization was practiced for respective wafers separately. One of the wafers having a porous layer was subjected to porosity measurement, and was found to have a porosity of about 16%.

(3) The wafer was placed in a CVD growth furnace, and heat-treated successively under the conditions below.

| | (a) Temperature: 900° C. |
|---|---|
| Pressure: | 20 Torr |
| Gas: | $H_2$, 230 (L/min) |
| | $SiH_4$, 0.005 (L/min) |
| Time: | 5 min |
| | (b) Temperature: 900° C. |
| Pressure: | 80 Torr |
| Gas: | $H_2/SiH_2Cl_2$ 230/0.4 (L/min) |

By the above heat treatments, monocrystalline silicon layers were formed in a thickness of about 0.30 μm.

In the crystal growth on one of the two wafers, the heat treatment (a) was omitted.

(4) The two wafers were treated respectively for oxidation in an atmosphere of a mixture of oxygen and hydrogen at 900° C. to form a silicon oxide film of 200 nm thick.

(5) The above wafer and a second wafer were cleaned chemically as in usual semiconductor process, cleaned finally by dipping into a diluted HF solution, and rinsed with pure water, and dried. The surfaces of the wafers were brought into contact together slowly. Thereby the two wafers came to be bonded and integrated. Then the bonded wafers were heat-treated at 800° C. for 2 hours.

(6) The reverse face of the wafer having porous silicon layer of the wafer was polished to bare the entire porous silicon on the entire face of the substrate. The wafer was immersed in an aqueous mixed solution containing HF, $H_2O_2$, and alcohol for about 2 hours to remove the porous silicon by etching. Thereby, about 0.2 μm thick the epitaxial silicon layer came to be transferred onto the second wafer with interposition of a silicon oxide film.

(7) This substrate was heat-treated at 1100° C. in a 100% hydrogen atmosphere for 4 hours.

(8) The entire surface of the epitaxial silicon layer was observed carefully with a Nomarskii differential interference microscope. The substrate having been prepared without the treatment (a) of the step (3) had about 100 pinholes on the surface, and voids which are considered to be formed by etching of the silicon oxide film by the etching solution having penetrated into the interface of bonding. The substrate having been prepared with the treatment (b) was observed to have only two voids.

| Pressure: | 20 Torr |
|---|---|
| Gas: | $H_2/SiH_2Cl_2$ 230/0.25 (L/min) |
| Time: | 5 min |

By the above heat treatments, monocrystalline silicon layers were formed in thickness of about 2 μm.

(9) The crystal defects were developed by Secco etching, and the density of the crystal defects in the monocrystalline silicon layer was measured by a Nomarskii differential interference microscope. As the results, most of the crystal defects were lamination defects, and the density was, depending on the temperature in the heat treatment (b), respectively, $2.1 \times 10^2/cm^2$ at 900° C., $3.4 \times 10^2/cm^2$ at 800° C., $1.2 \times 10^5/cm^2$ at 770° C., $5 \times 10^5/cm^2$ at 750° C., and $1.2 \times 10^6/cm^2$ at 700° C. L/min. Thus introduction of the heat-treatment (b) and the raise of the temperature from 770° C. to 800° C. remarkably decreased the lamination defect density by a factor of about $1/3$ to $1/1000$.

What is claimed is:

1. A process for producing a semiconductor substrate comprising:

growing on a porous silicon layer a nonporous monocrystalline silicon layer in an atmosphere containing at least silicon source gas and hydrogen gas and controlling growth rate such that the density of remaining pores on the crystal growth face is less than $1000/cm^2$ at the time when a monocrystalline silicon layer has grown to a thickness corresponding to the diameter of the pores of the porous silicon layer.

2. The process for producing a semiconductor substrate according to claim 1, wherein the nonporous monocrystalline silicon layer is grown on the porous silicon layer in a growth furnace by feeding a source gas thereto.

3. The process for producing a semiconductor substrate according to claim 2, wherein the source gas is selected from silane, dichlorosilane, trichlorosilane, tetrachlorosilane, and disilane.

4. The process for producing a semiconductor substrate according to any of claims 1 to 3, wherein the porous silicon layer is heated in a nonoxidative atmosphere prior to the growth of the nonporous monocrystalline silicon layer.

5. The process for producing a semiconductor substrate according to claim 4, wherein the nonoxidative atmosphere is a hydrogen atmosphere.

6. The process for producing a semiconductor substrate according to claim 4, wherein the process comprises a step of removing a natural oxide film prior to the growth of the nonporous monocrystalline silicon layer.

7. The process for producing a semiconductor substrate according to claim 6, wherein the growth rate is not higher than 20 nm/min.

8. The process for producing a semiconductor substrate according to claim 4, wherein the growth rate is not higher than 20 nm/min.

9. The process for producing a semiconductor substrate according to claim 5, wherein the process comprises a step of removing a natural oxide film prior to the growth of the nonporous monocrystalline silicon layer.

10. The process for producing a semiconductor substrate according to claim 5, wherein the growth rate is not higher than 20 nm/min.

11. The process for producing a semiconductor substrate according to claim 9, wherein the growth rate is not higher than 20 nm/min.

12. The process for producing a semiconductor substrate according to any of claims 1 to 3, wherein the process comprises a step of removing a natural oxide film prior to the growth of the nonporous monocrystalline silicon layer.

13. The process for producing a semiconductor substrate according to claim 12, wherein the growth rate is not higher than 20 nm/min.

14. The process for producing a semiconductor substrate according to any of claims 1 to 3, wherein the process comprises steps of forming an ultrathin film on a wall of the porous silicon layer, and removing an oxide film on the external surface of the porous silicon layer prior to the growth of the nonporous monocrystalline silicon layer.

15. The process for producing a semiconductor substrate according to claim 14, wherein the growth rate is not higher than 20 nm/min.

16. The process for producing a semiconductor substrate according to any of claims 1 to 3, wherein the process comprises steps of forming an ultrathin film on a wall of the porous silicon layer, removing an oxide film on the surface of the porous silicon layer, and heat-treating the porous silicon layer in a hydrogen atmosphere prior to the growth of the nonporous monocrystalline silicon layer.

17. The process for producing a semiconductor substrate according to claim 16, wherein the growth rate is not higher than 20 nm/min.

18. The process for producing a semiconductor substrate according to any of claims 1 to 3, wherein the growth rate is not higher than 20 nm/min.

19. The process for producing a semiconductor substrate according to claim 2, wherein the porous silicon layer is heated to a temperature of 900° C. or higher during the growth of the nonporous monocrystalline silicon layer.

20. The process for producing a semiconductor substrate according to claim 1, wherein the diameter of the pores is the largest pore diameter of the porous silicon layer.

21. A process for producing a semiconductor substrate comprising:

growing on a porous silicon layer a nonporous monocrystalline silicon layer at a first growth rate controlled such that the density of remaining pores on the crystal growth face is less than $1000/cm^2$ at the time when a monocrystalline silicon layer has grown to a thickness corresponding to the diameter of the pores of the porous silicon layer, and thereafter growing the nonporous monocrystalline silicon layer at a higher growth rate than said first growth rate.

22. The process for producing a semiconductor substrate according to claim 21, wherein the nonporous monocrystalline silicon layer is grown on the porous silicon layer in a growth furnace by feeding a source gas thereto.

23. The process for producing a semiconductor substrate according to claim 22, wherein the source gas is selected from silane, dichlorosilane, trichlorosilane, tetrachlorosilane, and disilane.

24. The process for producing a semiconductor substrate according to any of claims 21 to 23, wherein the porous silicon layer is heated in a, nonoxidative atmosphere prior to the growth of the nonporous monocrystalline silicon layer.

25. The process for producing a semiconductor substrate according to claim 24, wherein the nonoxidative atmosphere is a hydrogen atmosphere.

26. The process for producing a semiconductor substrate according to claim 24, wherein the process comprises a step of removing a natural oxide film prior to the growth of the nonporous monocrystalline silicon layer.

27. The process for producing a semiconductor substrate according to claim 26, wherein the growth rate is not higher than 20 nm/min.

28. The process for producing a semiconductor substrate according to claim 24, wherein the growth rate is not higher than 20 nm/min.

29. The process for producing a semiconductor substrate according to claim 25, wherein the process comprises a step of removing a natural oxide film prior to the growth of the nonporous monocrystalline silicon layer.

30. The process for producing a semiconductor substrate according to claim 25, wherein the growth rate is not higher than 20 nm/min.

31. The process for producing a semiconductor substrate according to claim 29, wherein the growth rate is not higher than 20 nm/min.

32. The process for producing a semiconductor substrate according to any of claims 21 to 23, wherein the process comprises a step of removing a natural oxide film prior to the growth of the nonporous monocrystalline silicon layer.

33. The process for producing a semiconductor substrate according to claim 32, wherein the growth rate is not higher than 20 nm/min.

34. The process for producing a semiconductor substrate according to any of claims 21 to 23, wherein the process comprises steps of forming an ultrathin film on a wall of the porous silicon layer, and removing an oxide film on the external surface of the porous silicon layer prior to the growth of the nonporous monocrystalline silicon layer.

35. The process for producing a semiconductor substrate according to claim 34, wherein the growth rate is not higher than 20 nm/min.

36. The process for producing a semiconductor substrate according to any of claims 21 to 23, wherein the process comprises steps of forming an ultrathin film on a wall of the porous silicon layer, removing an oxide film on the surface of the porous silicon layer, and heat-treating the porous silicon layer in a hydrogen atmosphere prior to the growth of the nonporous monocrystalline silicon layer.

37. The process for producing a semiconductor substrate according to claim 36, wherein the growth rate is not higher than 20 nm/min.

38. The process for producing a semiconductor substrate according to any of claims 21 to 23, wherein the growth rate is not higher than 20 nm/min.

39. The process for producing a semiconductor substrate according to claim 22, wherein the porous monocrystalline layer is heated to a temperature of 900° C. or higher during the growth of the nonporous monocrystalline silicon layer.

40. The process for producing a semiconductor substrate according to claim 21, wherein the diameter of the pores is the largest pore diameter of the porous monocrystalline silicon layer.

41. A process for producing a semiconductor substrate comprising:
  providing a first substrate having a porous silicon layer and a nonporous monocrystalline silicon layer grown thereon;
  laminating the nonporous silicon layer of the first substrate onto a second substrate with interposition of an insulation layer provided on at least one lamination face of the first substrate and the second substrate; and
  removing the porous silicon layer, wherein the nonporous monocrystalline silicon layer is grown in an atmosphere containing at least silicon source gas and hydrogen gas at a growth rate controlled such that the density of remaining pores on the crystal growth face is less than 1000/cm$^2$ at the time when a silicon layer has grown to a thickness corresponding to the diameter of the pores of the porous silicon layer.

42. The process for producing a semiconductor substrate according to claim 41, wherein the nonporous monocrystalline silicon layer is grown on the porous monocrystalline silicon layer in a growth furnace by feeding a source gas thereto.

43. The process for producing a semiconductor substrate according to claim 42, wherein the source gas is selected from silane, dichlorosilane, trichlorosilane, tetrachlorosilane, and disilane.

44. The process for producing a semiconductor substrate according to any of claims 41 to 43, wherein the porous silicon layer is heated in a nonoxidative atmosphere prior to the growth of the nonporous monocrystalline silicon layer.

45. The process for producing a semiconductor substrate according to claim 44, wherein the nonoxidative atmosphere is a hydrogen atmosphere.

46. The process for producing a semiconductor substrate according to claim 44, wherein the process comprises a step of removing a natural oxide film prior to the growth of the nonporous monocrystalline silicon layer.

47. The process for producing a semiconductor substrate according to claim 46, wherein the growth rate is not higher than 20 nm/min.

48. The process for producing a semiconductor substrate according to claim 44, wherein the growth rate is not higher than 20 nm/min.

49. The process for producing a semiconductor substrate according to claim 45, wherein the process comprises a step of removing a natural oxide film prior to the growth of the nonporous monocrystalline silicon layer.

50. The process for producing a semiconductor substrate according to claim 45, wherein the growth rate is not higher than 20 nm/min.

51. The process for producing a semiconductor substrate according to claim 49, wherein the growth rate is not higher than 20 nm/min.

52. The process for producing a semiconductor substrate according to any of claims 41 to 43, wherein the process comprises a step of removing a natural oxide film prior to the growth of the nonporous monocrystalline silicon layer.

53. The process for producing a semiconductor substrate according to claim 52, wherein the growth rate is not higher than 20 nm/min.

54. The process for producing a semiconductor substrate according to any of claims 41 to 43, wherein the process comprises steps of forming an ultrathin film on a wall of the porous silicon layer, and removing an oxide film on the external surface of the porous silicon layer prior to the growth of the nonporous monocrystalline silicon layer.

55. The process for producing a semiconductor substrate according to claim 54, wherein the growth rate is not higher than 20 nm/min.

56. The process for producing a semiconductor substrate according to any of claims 41 to 43, wherein the process comprises steps of forming an ultrathin film on a wall of the porous silicon layer, removing an oxide film on the surface of the porous silicon layer, and heat-treating the porous silicon layer in a hydrogen atmosphere prior to the growth of the nonporous monocrystalline silicon layer.

57. The process for producing a semiconductor substrate according to claim 56, wherein the growth rate is not higher than 20 nm/min.

58. The process for producing a semiconductor substrate according to any of claims 41 to 43, wherein the growth rate is not higher than 20 nm/min.

59. The process for producing a semiconductor substrate according to claim 42, wherein the porous silicon layer is heated to a temperature of 900° C. or higher during the growth of the nonporous monocrystalline silicon layer.

60. The process for producing a semiconductor substrate according to claim 41, wherein the diameter of the pores is the largest pore diameter of the porous silicon layer.

61. The process for producing a semiconductor substrate according to claim 41, wherein the insulation layer is formed on the first member.

62. The process for producing a semiconductor substrate according to claim 61, wherein the insulation layer is formed by thermal oxidation of the surface of the nonporous monocrystalline silicon layer.

63. The process for producing a semiconductor substrate according to claim 61 or 62, wherein the second member is a monocrystalline silicon substrate.

64. The process for producing a semiconductor substrate according to claim 63, wherein the oxide layer is formed on the lamination face of the second member.

65. The process for producing a semiconductor substrate according to claim 63, wherein the lamination face of the second member is constituted of monocrystalline silicon.

66. The process for producing a semiconductor substrate according to claim 61 or 62, wherein the second member is made of glass.

67. The process for producing a semiconductor substrate according to claim 41, wherein the insulation layer is formed on the second member.

68. The process for producing a semiconductor substrate according to claim 67, wherein the insulation layer is formed by thermal oxidation of the monocrystalline silicon substrate.

69. The process for producing a semiconductor substrate according to claim 67, wherein the insulation layer constitutes a glass substrate.

70. The process for producing a semiconductor substrate according to any of claims 67 to 69, wherein the lamination face of the first member comprises nonporous monocrystalline silicon layer.

71. A process for producing a semiconductor substrate comprising:

providing a first substrate having a porous silicon layer and a nonporous monocrystalline silicon layer grown thereon;

laminating the nonporous monocrystalline silicon layer of the first substrate onto a second substrate with interposition of an insulation layer provided on at least one lamination face of the first substrate and the second substrate; and removing the porous silicon layer, wherein the step of growing the nonporous monocrystalline silicon layer is conducted (i) at a first growth rate controlled such that the density of remaining pores on the crystal growth face is less than $1000/cm^2$ at the time when a monocrystalline silicon layer has grown to a thickness corresponding to the diameter of the pores of the porous monocrystalline silicon layer, and (ii) thereafter at a higher growth rate than said first growth rate.

72. The process for producing a semiconductor substrate according to claim 41 or 71, wherein said removing the porous silicon layer is carried out by etching.

73. The process for producing a semiconductor substrate according to claim 1 or 41, wherein said silicon source gas is selected from the group consisting of silane dichlorosilane, trichlorosilane, tetrachlorosilane, and disilane.

74. A process for producing a semiconductor substrate comprising:

providing a first substrate having a porous silicon layer and a nonporous monocrystalline silicon layer grown thereon;

laminating the nonporous silicon layer of the first substrate onto a second substrate; and removing the porous silicon layer, wherein the nonporous monocrystalline silicon layer is grown in an atmosphere containing at least silicon source gas and hydrogen gas at a growth rate controlled such that the density of remaining pores on the crystal growth face is less than $1000/cm^2$ at the time when a silicon layer has grown to a thickness corresponding to the diameter of the pores of the porous silicon layer.

75. A process for producing a semiconductor substrate comprising:

providing a first substrate having a porous silicon layer and a nonporous monocrystalline silicon layer grown thereon;

laminating the nonporous monocrystalline silicon layer of the first substrate onto a second substrate, and removing the porous silicon layer, wherein the step of growing the nonporous monocrystalline silicon layer is conducted (i) at a first growth rate controlled such that the density of remaining pores on the crystal growth face is less than $1000/cm^2$ at the time when a monocrystalline silicon layer has grown to a thickness corresponding to the diameter of the pores of the porous monocrystalline silicon layer, and (ii) thereafter at a higher growth rate than said first growth rate.

76. The process for producing a semiconductor substrate according to claim 74 or 75, wherein a temperature of said porous silicon layer is 900° C. or more but not exceeding the melting point of silicon during the growth of the nonporous monocrystalline silicon layer.

77. The process for producing a semiconductor substrate according to claim 74 or 75, wherein said second substrate is a silicon substrate, quartz glass or blue plate glass.

78. The process for producing semiconductor substrate according to claim 74 or 75, which process further includes a step of forming a protecting film on a pore wall of said porous silicon layer prior to the growth of said monocrystalline silicon layer.

79. The process for producing a semiconductor substrate according to claim 74 or 75, which process further includes a step of removing an oxide film on an external surface of said porous silicon layer prior to the growth of said monocrystalline silicon layer.

80. The process for producing a semiconductor substrate according to claim 74 or 75, which process further includes a step of heat-treating said porous silicon layer in an atmosphere containing hydrogen prior to the growth of said monocrystalline silicon layer.

81. The process for producing a semiconductor substrate according to claim 74 or 75 which process further includes a step of forming a protecting film on a pore wall of said porous silicon layer and removing an oxide film on an external surface of said porous silicon layer, prior to the growth of said monocrystalline silicon layer.

82. The process for producing a semiconductor substrate according to claim 74 or 75, which process further includes a step of forming a protecting film on a pore wall of said porous silicon layer, removing an oxide film on an external surface of said porous silicon layer, and heat-treating said porous silicon layer in an atmosphere containing hydrogen, prior to the growth of said monocrystalline silicon layer.

83. A process for producing a semiconductor substrate having a porous silicon layer and a nonporous monocrystalline silicon layer thereon, which comprises:

providing a substrate having a porous silicon layer; and growing a monocrystalline silicon layer on said porous silicon layer in an atmosphere containing at least silicon source gas and hydrogen gas at a growth rate of 20 nm/min or less.

84. A process for producing a semiconductor substrate having a porous silicon layer and a nonporous monocrystalline silicon layer thereon, which comprises:

providing a substrate having a porous silicon layer;

growing a monocrystalline silicon layer on said porous silicon layer at a growth rate of 20 nm/min or less; and growing a monocrystalline silicon layer at an increased growth rate larger than said growth rate of 20 nm/min or less.

85. A process for producing a semiconductor substrate which comprises:

providing a first substrate having a porous silicon layer;

growing a monocrystalline silicon layer on said porous silicon layer in an atmosphere containing at least silicon source gas and hydrogen gas at a growth rate of 20 nm/min or less;

bonding said first substrate to a second substrate such that said monocrystalline silicon layer is positioned inside; and removing said porous silicon layer.

86. A process for producing a semiconductor substrate which comprises:

providing a first substrate having a porous silicon layer;

growing a monocrystalline silicon layer on said porous silicon layer at a growth rate of 20 nm/min or less;

growing a monocrystalline silicon layer at an increased growth rate larger than said growth rate of 20 nm/min or less;

bonding said first substrate to a second substrate such that said monocrystalline silicon layer is positioned inside; and removing said porous silicon layer.

87. The process for producing a semiconductor substrate according to claim 85 or 86, including providing an insulating layer between said first and second substrates.

88. The process for producing a semiconductor substrate according to any of claims 83 through 86, including controlling a temperature of said porous silicon layer to be 900° C. or more, but not exceeding the melting point of the porous silicon layer, during the step of growing the nonporous monocrystalline silicon layer.

89. The process for producing a semiconductor substrate according to any of claims 83 through 86, which process further includes a step of forming a protective film on a pore wall of said porous monocrystalline silicon layer prior to the growth of said monocrystalline silicon layer.

90. The process for producing a semiconductor substrate according to any of claims 83 through 86, which process further includes a step of removing an oxide film on an external surface of said porous monocrystalline silicon layer prior to the growth of said monocrystalline silicon layer.

91. The process for producing a semiconductor substrate according to any of claims 83 through 86, which process further includes a step of heat-treating said porous monocrystalline silicon layer in a reducing atmosphere containing at least hydrogen or nitrogen, or in an atmosphere of inert gas, prior to the growth of said monocrystalline silicon layer.

92. The process for producing a semiconductor substrate according to any of claims 83 through 86, which process further includes a step of forming a protective film on a pore wall of said porous silicon layer and removing an oxide film on an external surface of said porous silicon layer, prior to the growth of said monocrystalline silicon layer.

93. The process for producing a semiconductor substrate according to any of claims 83 through 86, which process further includes the steps of forming a protective film on a pore wall of said porous silicon layer, and heat-treating said porous silicon layer in an atmosphere containing hydrogen, prior to the growth of said monocrystalline silicon layer.

94. The process for producing a semiconductor substrate according to claims 74, 83, and 85, wherein said silicon source gas is selected from a group consisting of silane, dichlorosilane, trichlorosilane, tetrachlorosilane and disilane.

95. The process for producing a semiconductor substrate according to claims 1, 21, 41, 71, 74 or 75, wherein said density of remaining pores is measured by a gas adsorption method or an observation by means of ultrahigh resolution scanning electron microscopy.

96. The process for producing a semiconductor substrate according to claims 21, 71, 75, 84 or 86, wherein silane ($SiH_4$) is used as a silicon source gas when said nonporous monocrystalline silicon layer is grown at said first growth rate, and dichlorosilane ($SiH_2Cl_2$) is used as a silicon source gas when said nonporous monocrystalline silicon layer is grown at a higher growth rate than said first growth rate.

97. The process for producing a semiconductor substrate according to claims 21, 71, 75, 84 or 86, wherein dichlorosilane ($SiH_2Cl_2$) is used as a silicon source gas when said nonporous monocrystalline silicon layer is grown at said first growth rate, and dichlorosilane ($SiH_2Cl_2$) is used as a source gas when said nonporous monocrystalline silicon layer is grown at a higher growth rate than said first growth rate.

98. The process for producing a semiconductor substrate according to claims 21, 71, 75, 84 or 86, wherein silane ($SiH_4$) is used as a silicon source gas when said nonporous monocrystalline silicon layer is grown at said first growth rate, and silane ($SiH_4$) is used as a silicon source gas when said nonporous monocrystalline silicon layer is grown at a higher growth rate than said first growth rate.

99. The process for producing a semiconductor substrate according to claims 83, 84, 85 or 86, wherein said growth rate is not more than 10 nm/min.

100. The process for producing a semiconductor substrate according to claims 83, 84, 85 or 86, wherein said growth rate is not more than 2 nm/min.

101. The process for producing a semiconductor substrate according to claims 1, 21, 41, 71, 74, 75, 83, 84, 85 or 86, wherein said growing of said nonporous monocrystalline silicon layer is carried out under a pressure of 10 to 760 Torr.

102. The process for producing a semiconductor substrate according to claims 1, 21, 41, 71, 74, 75, 83, 84, 85 or 86, wherein said growing of said nonporous monocrystalline silicon layer is carried out at a temperature of not lower than 800° C.

103. The process for producing a semiconductor substrate according to claims 1, 21, 41, 71, 74, 75, 83, 84, 85 or 86, wherein prior to said growing of said nonporous monocrystalline silicon layer said porous silicon layer is heat-treated under an atmosphere containing hydrogen, and said heat-treating under the atmosphere containing hydrogen and said growing of the nonporous monocrystalline silicon layer are conducted successively in a same CVD growth furnace.

* * * * *

UNITED STATES PATENT AND TRADEMARK OFFICE
CERTIFICATE OF CORRECTION

PATENT NO. : 6,136,684
DATED : October 24, 2000
INVENTOR(S) : Nobuhiko Sato et al.

It is certified that error appears in the above-identified patent and that said Letters Patent is hereby corrected as shown below:

Title page,
Item [56], References Cited, under FOREIGN PATENT DOCUMENTS:
"5021338" should read -- 5-21338 --.

Column 1,
Line 24, "made selectively" should read -- selectively made --.

Column 2,
Line 5, "investigation" should read -- investigations --; and
Line 60, "is" should read -- are --.

Column 3,
Line 44, "on" should read -- in --;
Line 45, "wafer," should read -- wafers, --;
Line 49, "the" should be deleted;
Line 52, "cleaned" should read -- optionally cleaned, --;
Line 53, "optionally," should be deleted; and
Line 61, "this" should be deleted.

Column 5,
Line 38, "to decrease of" should read -- is also effective to decrease --.

Column 9,
Line 4, "silicon on" should read -- silicon film on --; and
Line 45, "entire of the" should read -- entire --.

Column 10,
Line 1, "tends" should read -- tend --.

Column 13,
Line 51, "rate" should read -- rates --.

Column 14,
Line 35, "of warpage" should be deleted.

Column 15,
Line 15, "remains" should read -- remain --.

Column 16,
Line 13, "in" should read -- in the --.

UNITED STATES PATENT AND TRADEMARK OFFICE
CERTIFICATE OF CORRECTION

PATENT NO. : 6,136,684
DATED : October 24, 2000
INVENTOR(S) : Nobuhiko Sato et al.

It is certified that error appears in the above-identified patent and that said Letters Patent is hereby corrected as shown below:

Column 17,
Line 45, "not" should read -- does not --.

Column 18,
Line 29, "may" should read -- may be --.

Column 19,
Line 8, "entire of the" should read -- entire --; and
Line 18, "wafer" should read -- layer --.

Column 20,
Line 25, "entire of the" should read -- entire --; and
Line 39, "less" should read -- or less --.

Column 21,
Line 45, "entire of the" should read -- entire --.

Column 22,
Line 44, "entire of the" should read -- entire --.

Column 23,
Line 66, "entire of the" should read -- entire --.

Column 24,
Line 8, "wafer" should read -- layer --; and
Line 41, "entire of the" should read -- entire --.

Column 25,
Line 35, "entire of the" should read -- entire --; and
Line 45, "wafer" should read -- layer --.

Column 26,
Line 58, "entire of the" should read -- entire --.

Column 27,
Line 35, "$5 \times 10^5 cm^2$" should read -- $5 \times 10^5 / cm^2$ --;
Line 36, $1.2 \times 10^6 cm$ at 700°C. L/min." should read -- $1.2 \times 10^6 / cm^2$ at 700°C. --;
Line 55, "entire of the" should read -- entire --;
Line 60, "of" should be deleted; and
Line 67, "was" should read -- were --.

UNITED STATES PATENT AND TRADEMARK OFFICE
CERTIFICATE OF CORRECTION

PATENT NO. : 6,136,684
DATED : October 24, 2000
INVENTOR(S) : Nobuhiko Sato et al.

It is certified that error appears in the above-identified patent and that said Letters Patent is hereby corrected as shown below:

Column 28,
Line 44, "entire of the" should read -- entire --;
Line 49, "of" should be deleted;
Line 54, "wafer" should read -- layer --; and
Line 67, "the" should read -- the following --.

Column 29,
Line 64, "entire of the" should read -- entire --.

Column 30,
Line 2, "of" should be deleted; and
Line 40, "thick" should read -- of --.

Column 31,
Line 3, "$1.2 \times 10^5 Cm^2$ at 770°C., $5 \times 10^5 cm^2$" should read -- $1.2 \times 10^5 /cm^2$ at 770°C., $5 \times 10^5 /cm^2$ --; and
Line 4, "$1.2 \times 10^6 cm^2$ at 700°C. L/min." should read -- $1.2 \times 10^6 /cm$ at 700°C. --.

Column 32,
Line 40, "a," should read -- a --.

Column 33,
Line 32, "monocrystalline" should be deleted; and
Line 54, "monocrystalline" should deleted.

UNITED STATES PATENT AND TRADEMARK OFFICE
CERTIFICATE OF CORRECTION

PATENT NO. : 6,136,684
DATED : October 24, 2000
INVENTOR(S) : Nobuhiko Sato et al.

It is certified that error appears in the above-identified patent and that said Letters Patent is hereby corrected as shown below:

Column 37,
Line 35, "monocrystalline" should be deleted;
Line 4, "monocrystalline" should be deleted;
Line 44, "monoc-" should be deleted; and
Line 45, "rystalline" should be deleted.

Signed and Sealed this

Fifth Day of February, 2002

Attest:

JAMES E. ROGAN
Director of the United States Patent and Trademark Office

Attesting Officer